US010157666B2

(12) United States Patent
Singh et al.

(10) Patent No.: US 10,157,666 B2
(45) Date of Patent: *Dec. 18, 2018

(54) FLYING AND TWISTED BIT LINE ARCHITECTURE FOR DUAL-PORT STATIC RANDOM-ACCESS MEMORY (DP SRAM)

(71) Applicant: Taiwan Semiconductor Manufacturing Co., Ltd., Hsin-Chu (TW)

(72) Inventors: Sahil Preet Singh, Hsinchu (TW); Jung-Hsuan Chen, Hsinchu (TW); Yen-Huei Chen, Jhudong Township (TW); Avinash Chander, Jhubei (TW); Albert Ying, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/871,484

(22) Filed: Jan. 15, 2018

(65) Prior Publication Data
US 2018/0137910 A1    May 17, 2018

Related U.S. Application Data

(63) Continuation of application No. 15/388,991, filed on Dec. 22, 2016, now Pat. No. 9,928,899.

(Continued)

(51) Int. Cl.
*G11C 8/00*    (2006.01)
*G11C 11/419*    (2006.01)
(Continued)

(52) U.S. Cl.
CPC .......... *G11C 11/419* (2013.01); *G11C 7/1075* (2013.01); *G11C 8/16* (2013.01);
(Continued)

(58) Field of Classification Search
CPC . G11C 11/419; H01L 23/528; H01L 23/5226; H01L 27/1104
(Continued)

(56) References Cited

U.S. PATENT DOCUMENTS 5,107,459 A * 4/1992 Chu .................. H01L 27/10841
257/302
5,586,072 A    12/1996 Longway et al.
(Continued)

FOREIGN PATENT DOCUMENTS

TW            I424443 B    1/2014

OTHER PUBLICATIONS

Non-Final Office Action dated Jun. 15, 2017 for U.S. Appl. No. 15/388,991.
(Continued)

*Primary Examiner* — Vu Le
(74) *Attorney, Agent, or Firm* — Eschweiler & Potashnik, LLC

(57) ABSTRACT

A bit line architecture for dual-port static random-access memory (DP SRAM) is provided. An array of memory cells is arranged in rows and columns, and comprises a first subarray and a second subarray. A first pair of complementary bit lines (CBLs) extends along a column, from a first side of the array, and terminates between the first and second subarrays. A second pair of CBLs extends from the first side of the array, along the column, to a second side of the array. The CBLs of the second pair of CBLs have stepped profiles between the first and second subarrays. A third pair of CBLs and a fourth pair of CBLs extend along the column. The first and third pairs of CBLs electrically couple to memory cells in the first subarray, and the second and fourth pairs of CBLs electrically couple to memory cells in the second subarray.

20 Claims, 15 Drawing Sheets

Related U.S. Application Data

(60) Provisional application No. 62/272,170, filed on Dec. 29, 2015.

(51) Int. Cl.
| | | |
|---|---|---|
| *H01L 23/522* | (2006.01) | |
| *H01L 23/528* | (2006.01) | |
| *H01L 27/11* | (2006.01) | |
| *G11C 7/10* | (2006.01) | |
| *G11C 8/16* | (2006.01) | |
| *G11C 11/412* | (2006.01) | |
| *H01L 49/02* | (2006.01) | |

(52) U.S. Cl.
CPC .......... *G11C 11/412* (2013.01); *H01L 23/528* (2013.01); *H01L 23/5226* (2013.01); *H01L 27/1104* (2013.01); *H01L 28/00* (2013.01)

(58) Field of Classification Search
USPC .............................. 365/230.05, 63, 156, 190
See application file for complete search history.

(56) References Cited

U.S. PATENT DOCUMENTS

| | | |
|---|---|---|
| 5,877,976 A | 3/1999 | Lattimore et al. |
| 6,498,758 B1 | 12/2002 | Pomar et al. |
| 6,853,572 B1 | 2/2005 | Sabharwal |
| 7,719,868 B2 | 5/2010 | Vollrath |
| 9,558,809 B1 | 1/2017 | Liaw |
| 2003/0035322 A1 | 2/2003 | Wong |
| 2004/0136228 A1 | 7/2004 | Campardo et al. |
| 2005/0045918 A1* | 3/2005 | Reith .................. H01L 23/5222 257/208 |
| 2005/0078547 A1 | 4/2005 | Iwanari et al. |
| 2006/0092732 A1 | 5/2006 | Kang et al. |
| 2006/0098469 A1 | 5/2006 | Yang et al. |
| 2006/0098508 A1 | 5/2006 | Choi et al. |
| 2011/0299340 A1 | 12/2011 | Samachisa et al. |
| 2012/0106281 A1 | 5/2012 | Kim et al. |
| 2012/0113731 A1 | 5/2012 | Shimano et al. |

OTHER PUBLICATIONS

Notice of Allowance dated Oct. 6, 2017 for U.S. Appl. No. 15/388,991.

* cited by examiner

FLYING AND TWISTED BIT LINE ARCHITECTURE FOR DUAL-PORT STATIC RANDOM-ACCESS MEMORY (DP SRAM)

REFERENCE TO RELATED APPLICATIONS

This application is a Continuation of U.S. application Ser. No. 15/388,991, filed on Dec. 22, 2016, which claims the benefit of U.S. Provisional Application No. 62/272,170 filed on Dec. 29, 2015. The contents of the above-referenced applications are hereby incorporated by reference in their entirety.

BACKGROUND

Semiconductor memory is an electronic data storage device implemented on a semiconductor-based integrated circuit. Semiconductor memory has many different types, and has faster access times than other data storage technologies. For example, a byte of data can often be written to or read from semiconductor memory within a few nanoseconds, while access times for rotating storage, such as hard disks, is in the range of milliseconds. For these reasons, among others, semiconductor memory is used as a primary storage mechanism for computers to hold data computers are currently working on, among other uses.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
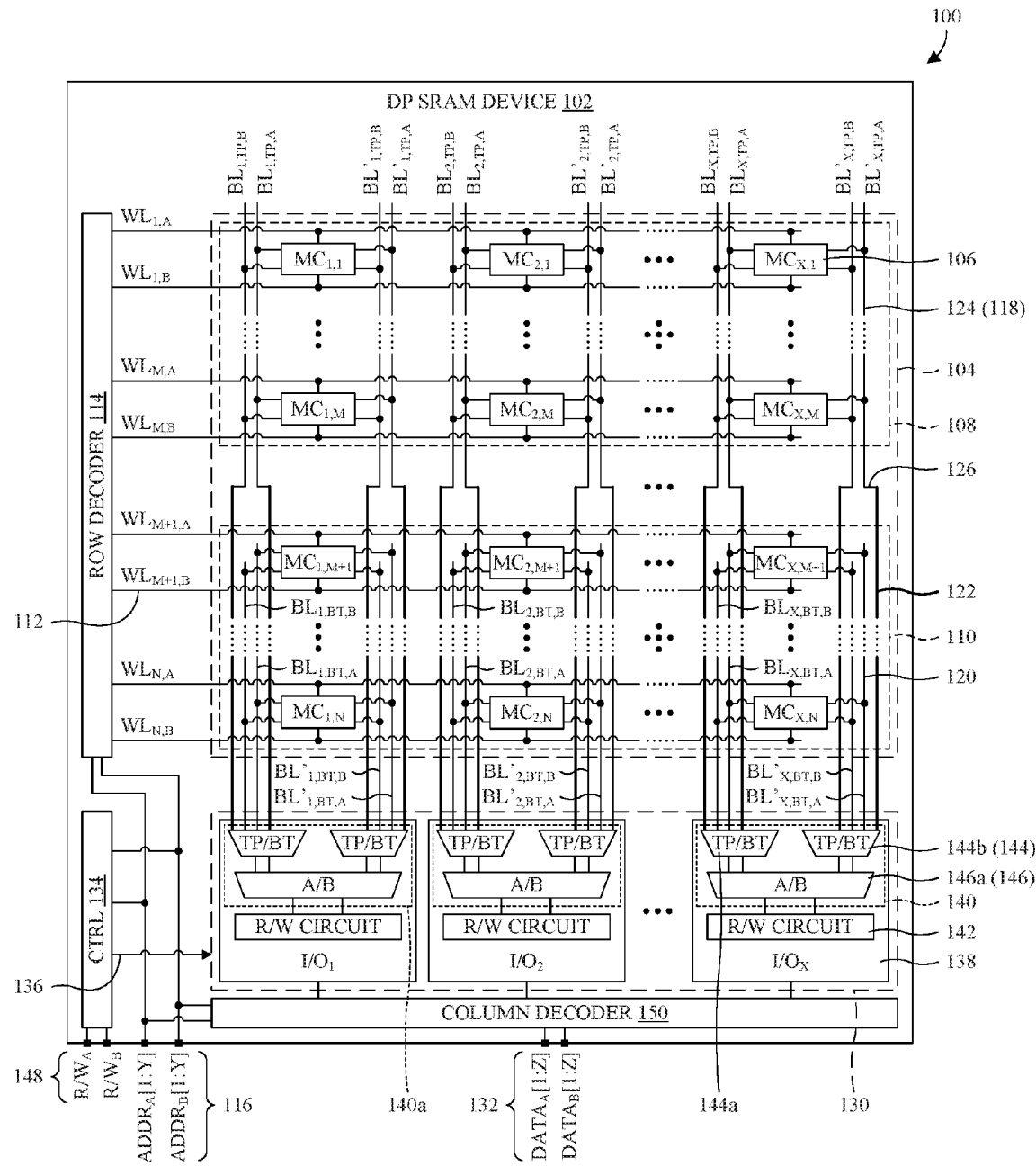
FIG. 1 illustrates a block diagram of some embodiments of a dual-port static random-access memory (DP SRAM) device with jump cells.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., a pair of bit lines) may be referred to as a "first" element in some embodiments, the element may be referred to as a "second" element in other embodiments.

One type of semiconductor memory is dual-port (DP) static random-access memory (SRAM). A DP SRAM device allows two memory accesses to occur at the same time, or at nearly the same time, respectively through two "ports". The DP SRAM device comprises one or more banks of memory cells, where each bank of memory cells comprises a plurality of memory cells arranged in rows and columns. Two word lines correspond to the two ports and extend along each row, electrically coupling with each memory cell in the row. Two pairs of complementary bit lines (CBLs) correspond to the two ports and extend along each column, electrically coupling with each memory cell in the column. The word lines of each port allow access to the memory cells on a row-by-row basis, and the CBLs of each port allow data states to be written to or read from accessed memory cells on a column-by-column basis.

A bank of memory cells often has between 128 rows and 512 rows. However, this leads to long bit lines, and hence high loads on the bit lines. The high loads on the bit lines may, in turn, lead to high minimum read voltages and high minimum write voltages on the bit lines. Read voltages and write voltages below the high minimum read voltages and the high minimum write voltages lead to instability while reading from and writing to the memory cells. Further, the high minimum read voltages and the high minimum write voltages may, in turn, lead to high dynamic power consumption. One solution to mitigate the effects of long bit lines is to use smaller banks of memory cells. For example, one large bank of memory cells with 128 rows can be replaced with two small banks of memory cells each with 64 rows. However, increasing the number of banks increases the area used by the memory cells, which may increase costs.

Additionally, the bit lines often run parallel to one another and are separated from one another by only a small space. As technology improves and feature sizes become smaller, adjacent bit lines will become even more closely spaced. However, this close spacing results in a significant amount of capacitive coupling, especially for long bit lines extending continuously along an entire column of a bank. The capacitive coupling may, in turn, lead to slow read and write times, and may further lead to a degradation of signal-to-noise margins.

In view of the foregoing, the present application is directed towards a flying and/or twisted bit line architecture for DP SRAM. In some embodiments, a DP SRAM device comprises an array of memory cells arranged in rows and columns, where the array includes a first subarray of memory cells and a second subarray of memory cells. A first pair of CBLs extends along a column of the array, from a first side of the array, and terminates between the first and second subarrays. Further, the first pair of CBLs is electrically coupled to memory cells of the first subarray in the column. A second pair of CBLs extends from the first side of the array, along the column, to a second side of the array. The second pair of CBLs is electrically coupled to memory cells of the second subarray in the column. Further, in some embodiments, the CBLs of the second pair of CBLs have stepped profiles between the first and second subarrays. A third pair of CBLs and a fourth pair of CBLs extend along the column. The third and fourth pairs of CBLs are electrically coupled respectively to the memory cells of the first subarray and the memory cells of the second subarray. Further, in some embodiments, the CBLs of the third or fourth pair of CBLs have stepped profiles between the first and second subarrays.

Advantageously, the stepped profiles of the second pair of CBLs allow the CBLs of the second pair to "fly" over the first subarray, and subsequently step down to the second subarray for electrical coupling with the memory cells of the second subarray. Similarly, the stepped profiles of the third or fourth pair of CBLs allow the CBLs of the third or fourth pair to "fly" over one of the first and second subarrays to the other one of the first and second subarrays for electrical coupling with memory cells in the other one of the first and second subarrays. Further, dividing the array into multiple segments, each with individual pairs of CBLs, advantageously facilitates low loads on the CBLs since each pair of CBLs carries a fraction of the total load for a respective column. The low loads may, in turn, lead to low minimum read voltages and low minimum write voltages on the CBLs. The low minimum read voltages and the low minimum write voltages may, in turn, lead to low dynamic power consumption. Further, the low loads may, in turn, allow the DP SRAM device to use a small area for a given memory size since individual memory banks can be large.

In some embodiments, the DP SRAM device further comprises a pair of twist cells configured to respectively twist a first pair of neighboring bit lines and a second pair of neighboring bit lines. The neighboring bit lines of the first pair of neighboring bit lines are respectively from two pairs of CBLs extending along the column, and the neighboring bit lines of the second pair of neighboring bit lines are respectively from the two pairs of CBLs. Further, the two pairs of CBLs correspond to two of the first, second, third, and fourth pairs of CBLs. For example, the two pairs of CBLs may correspond to the first and third pairs of CBLs. As another example, the two pairs of CBLs may correspond to the second and fourth pairs of CBLs. Advantageously, the twist cells facilitate low capacitive coupling between neighboring bit lines since the twist cells break up parallel surfaces of the neighboring bit lines. The low capacitive coupling may, in turn, lead to high capacitive matching between pairs of CBLs, high read and/or write times, and good signal-to-noise margins.

With reference to FIG. 1, a block diagram 100 of some embodiments of a DP SRAM device 102 is provided. The DP SRAM device 102 comprises a memory cell array 104. The memory cell array 104 comprises a plurality of memory cells 106 arranged in X columns and N rows, where X and N are integers greater than zero and may be the same or different. For clarity, the memory cells 106 are individually labeled as $MC_{<column>,<row>}$ in FIG. 1. Further, the memory cell array 104 comprises a top memory cell subarray 108 accommodating memory cells in rows 1 to M, and further comprises a bottom memory cell subarray 110 accommodating memory cells in rows M+1 to N, where M is an integer greater than zero and less than N. In some embodiments, M is half of N. For example, M may be 256 and N may be 512.

The memory cells 106 are located at the intersections of respective columns and respective rows, and respectively have internal data states. For example, each of the memory cells 106 may have an internal data state representing a single bit of data. Further, in some embodiments, the internal data states are defined by bistable latching circuits. As will be discussed in more detail below, during operation of the DP SRAM device 102, the memory cells 106 may be accessed on a row-by-row basis to read and/or write data to internal data states of the accessed memory cells. Further, two memory accesses may be carried out at the same time, or at nearly the same time, respectively through two "ports" of the DP SRAM device 102. For clarity, the ports are identified by subscripts "A" and "B" in FIG. 1.

A set of word lines 112 facilitates access to the memory cells 106 on a row-by-row basis. The word lines 112 comprise a pair of word lines for each row, where the pair comprises a first word line for port A (i.e., a port A word line) and a second word line for port B (i.e., a port B word line). For example, the word lines 112 may comprise word lines $WL_{1,A}$ and $WL_{1,B}$ for row 1. Further, the word lines 112 extend laterally from a row decoder 114, along respective rows, to electrically couple with memory cells in the respective rows. For clarity, the word lines 112 are individually labeled as $WL_{<row>,<port>}$ in FIG. 1.

The row decoder 114 is configured to selectively enable the word lines 112 based on address signals 116 respectively for the ports. For clarity, the address signals 116 are labeled as $ADDR_{<port>}$. The address signals 116 carry respective Y-bit addresses, where Y is an integer value greater than zero. A Y-bit address for a port identifies a row of the memory cell array 104, as well as Z columns of the memory cell array 104, thereby identifying Z memory cells at the intersection of the row and the Z columns. For example, a predetermined number of the most or least significant bits in the Y-bit address may identify the row of the memory cell array 104, whereas the remaining bits in the Y-bit address may identify the Z columns of the memory cell array 104. Z is an integer greater than zero, such as, for example, 1, 8, 16, 32, 64, 128, or X. Further, the Z memory cells may, for example, define a unit of data, such as a word.

A set of top bit lines 118 for the top memory cell subarray 108, and a set of bottom bit lines 120 for the bottom memory cell subarray 110, facilitate reading from and/or writing to accessed memory cells. The top bit lines 118 comprise two pairs of complementary bit lines (CBLs) for each column, where the two pairs comprise a first pair of CBLs for port A (i.e., a top, port A pair of CBLs) and a second pair of CBLs for port B (i.e., a top, port B pair of CBLs). For example, the top bit lines 118 may comprise bit lines $BL_{2,TP,A}$ and $BL'_{2,TP,A}$, as well as bit lines $BL_{2,TP,B}$ and $BL'_{2,TP,B}$, for column 2. Similarly, the bottom bit lines 120 comprise two pairs of CBLs for each column, where the two pairs comprise a third pair of CBLs for port A (i.e., a bottom, port A pair of CBLs) and a fourth pair of CBLs for port B (i.e., a bottom, port B pair of CBLs). For example, the bottom bit lines 120 may comprise bit lines $BL_{1,BT,A}$ and $BL'_{1,BT,A}$, as well as bit lines $BL_{1,BT,B}$ and $BL'_{1,BT,B}$, for column 1. Two bit lines of a pair of CBLs (e.g., $BL_{X,TP,A}/BL'_{X,TP,A}$) are complementary in that, during operation of the DP SRAM device 102, one of the two bit lines is biased to carry a first voltage level corresponding to a logical "1", while the other one of the two bit lines is biased to carry a second voltage level corresponding to a logical "0". For clarity, the two bit lines of each pair of CBLs are respectively labeled as $B_{<row>,<subarray>,<port>}$ and $BL'_{<row>,<subarray>,<port>}$ in FIG. 1.

Advantageously, using separate bit lines for the top memory cell subarray 108 and the bottom memory cell subarray 110 leads to low loads on the top and bottom bit lines 118, 120. For example, where M is half of N, the top and bottom bit lines 118, 120 have loads that are about half of the total loads for the respective columns. The low loads on the top and bottom bit lines 118, 120 may, in turn, lead to low minimum read voltages and low minimum write voltages on the top and bottom bit lines 118, 120. Further, the low minimum read voltages and the low minimum write voltages may, in turn, lead to low dynamic power consumption. Moreover, using separate bit lines for the top memory cell subarray 108 and the bottom memory cell subarray 110 advantageously allows the DP SRAM device 102 to use a small area for a given memory size since individual memory banks (discussed hereafter) can be large.

The top bit lines 118 extend laterally along respective columns, from a first side of the memory cell array 104 to a second side of the memory cell array 104 that is opposite the first side. Further, the top bit lines 118 electrically couple with memory cells of the top memory cell subarray 108 (e.g., $MC_{1,1}$ to $MC_{1,M}$ in column 1) that are in the respective columns to allow each port to read from and/or write to accessed memory cells of the top memory cell subarray 108 on a column-by-column basis. The top bit lines 118 each comprise a fly bit line segment 122, a local bit line segment 124, and a jump cell 126.

The fly bit line segments 122 of the top bit lines 118 extend along respective columns of the memory cell array 104, from the first side of the memory cell array 104, and terminate between the top and bottom memory cell subarrays 108, 110. The local bit line segments 124 of the top bit lines 118 extend from between the top and bottom memory cell subarrays 108, 110, along respective columns, to the second side of the memory cell array 104. In some embodiments, the local bit line segments 124 are laterally spaced respectively from the fly bit line segments 122 in a direction that is substantially parallel to the rows.

While not visible in FIG. 1, in some embodiments, the local bit line segments 124 are spaced above or below the fly bit line segments 122 in a direction that is substantially orthogonal to the rows and the columns, such that the top bit lines 118 have a step down or step up when transitioning from the fly bit line segments 122 to the local bit line segments 124. For example, the fly bit line segments 122 may be in a metal 2 layer of a back-end-of-line (BEOL) interconnect structure, and the local bit line segments 124 may be in a metal 0 layer of the BEOL interconnect structure. As another example, the fly bit line segments 122 may be in a metal 0 layer of a BEOL interconnect structure, and the local bit line segments 124 may be in a metal 2 layer of the BEOL interconnect structure. As yet another example, the fly bit line segments 122 and the local bit line segments 124 may be in different metal layers of a BEOL interconnect structure. Alternatively, in other embodiments, the fly bit line segments 122 and the local bit line segments 124 are in the same metal layer of a BEOL interconnect structure.

The jump cells 126 of the top bit lines 118 are between the top and bottom memory cell subarrays 108, 110, and electrically couple the fly bit line segments 122 respectively to the local bit line segments 124. The jump cells 126 extend laterally at an angle to the columns (e.g., substantially orthogonal to the columns), respectively from ends of the fly bit line segments 122 respectively to ends of the local bit line segments 124. Further, the jump cells 126 extend orthogonal to the rows and the columns (e.g., vertically) respectively from ends of the fly bit line segments 122 respectively to ends of the local bit line segments 124.

The bottom bit lines 120 extend laterally along respective columns, from the first side of the memory cell array 104, and terminate between row M+1 and the jump cells 126. In contrast with the top bit lines 118, the bottom bit lines 120 do not have fly bit line segments. Further, the bottom bit lines 120 electrically couple with memory cells of the bottom memory cell subarray 110 (e.g., $MC_{2,M+1}$ to $MC_{2,N}$ in column 2) that are in the respective columns to allow each data port to read from and/or write to accessed memory cells of the bottom memory cell subarray 110 on a column-by-column basis. In some embodiments, the bottom bit lines 120 are laterally spaced respectively from the fly bit line segments 122 in a direction that is substantially parallel to the rows, and/or are aligned to the local bit line segments 124.

While not visible in FIG. 1, in some embodiments, the bottom bit lines 120 are spaced above or below the fly bit line segments 122 in a direction that is substantially orthogonal to the rows and the columns. Such spacing may be, for example, by the same amount or a different amount as the spacing between the local bit line segments 124 and the fly bit line segments 122 in a direction substantially orthogonal to the rows and the columns. For example, the bottom bit lines 120 and the local bit line segments 124 may be in a metal 0 layer of a BEOL interconnect structure, whereas the fly bit line segments 122 may be in a metal 2 layer of the BEOL interconnect structure. As another example, the bottom bit lines 120 and the local bit line segments 124 may be a metal 2 layer of a BEOL interconnect structure, whereas the fly bit line segments 122 may be in a metal 0 layer of the BEOL interconnect structure. As yet another example, the bottom bit lines 120 may be in a metal 1 layer of a BEOL interconnect structure, the local bit line segments 124 may be a metal 0 layer of the BEOL interconnect structure, and the fly bit line segments 122 may be in a metal 2 layer of the BEOL interconnect structure. Alternatively, in other embodiments, the bottom bit lines 120 and the fly bit line segments 122 are in the same metal layer of a BEOL interconnect structure.

As noted above, the loads on the top and bottom bit lines 118, 120 are advantageously low. In some embodiments, the loads on the top bit lines 118 are about equal to the intrinsic loads of the top bit lines 118 (e.g., due to internal resistances) plus the loads imposed by the memory cells of the top memory cell subarray 108. For example, bit line $BL_{1,TP,A}$ may have a load that is about equal to the intrinsic load of bit line $BL_{1,TP,A}$ plus the load of memory cells $MC_{1,1}$ through memory cell $MC_{1,M}$ in column 1. Similarly, in some embodiments, the loads on the bottom bit lines 120 are about equal to the intrinsic loads of the bottom bit lines 120 plus the loads imposed by the memory cells of the bottom memory cell subarray 110. For example, bit line $BL_{2,BT,B}$ may have a load that is about equal to the intrinsic load of bit line $BL_{2,BT,B}$ plus the load of memory cells $MC_{2,M+1}$ through memory cell $MC_{2,N}$ in column 2. Accordingly, where M is half of N, the top and bottom bit lines 118, 120 have about the same loads, but the top bit lines 118 have slightly higher loads due to the fly bit line segments 122.

An input/output (I/O) array 130 is configured to use the top and/or bottom bit lines 118, 120 to read from and/or write to memory cells accessed by the word lines 112 and the row decoder 114. Further, in some embodiments, the I/O array 130 is configured to output data read from the accessed memory cells to data signals 132 respectively for the ports, and/or to write data input on the data signals 132 to the accessed memory cells. The data signals 132 carry Z bit data values and are labeled as $DATA_{<port>}$. The I/O array 130 is controlled by a controller 134 through control signals 136, and comprises a plurality of I/O cells 138. The I/O cells 138 correspond to the columns of the memory cell array 104 and are labeled as $I/O_{<column>}$. Further, the I/O cells 138 are electrically coupled with top and bottom bit lines of the corresponding columns. For example, $I/O_1$ may be electrically coupled with $BL_{1,TP,B}$, $BL_{1,TP,A}$, $BL'_{1,TP,B}$, and $BL'_{1,TP,A}$, as well as $BL_{1,BT,B}$, $BL_{1,BT,A}$, $BL'_{1,BT,B}$, and $BL'_{1,BT,A}$. The I/O cells 138 each comprise a selection circuit 140 and a read/write (R/W) circuit 142.

The selection circuits 140 are configured to select pairs of CBLs corresponding to the Y-bit addresses on the address signals 116. For example, where a Y-bit address on the port A address signal (i.e., $ADDR_A$) identifies row 1 and column 1, a selection circuit 140a for column 1 selects bit lines $BL_{1,TP,A}/BL'_{1,TP,A}$, since this pair of CBLs corresponds to the Y-bit address. Further, the selection circuits 140 are configured to select the pairs of CBLs based on the control signals 136 from the controller 134. For example, the controller 134 may be configured to decode the Y-bit addresses, and to generate the control signals 136 so the selection circuits 140 select the pairs of CBLs corresponding to the Y-bit addresses.

In some embodiments, the selection circuits 140 each comprise a pair of subarray multiplexers 144 and a port multiplexer 146. The subarray multiplexers 144 are configured to select between respective top bit lines (i.e., bit lines of the top memory cell subarray 108) and respective bottom bit lines (i.e., bit lines of the bottom memory cell subarray 110). For example, a first subarray multiplexer 144a for column X may be configured to select either: $BL_{X,BT,B}$ and $BL_{X,BT,A}$; or $BL_{X,TP,B}$ and $BL_{X,TP,A}$, whereas a second subarray multiplexer 144b for column X may be configured to select either: $BL'_{X,BT,B}$ and $BL'_{X,BT,A}$; or $BL'_{X,TP,B}$ and $BL'_{X,TP,A}$. The port multiplexers 146 are configured to select between respective bit lines for port A and respective bit lines for port B. For example, a port multiplexer 146a for column X may be configured to select $BL_{X,BT,B}$ and $BL'_{X,BT,B}$; or $BL_{X,BT,A}$ and $BL'_{X,BT,A}$. In some embodiments, the port multiplexers 146 are electrically coupled to the subarray multiplexers 144, such that the port multiplexers 146 select from bit lines selected by the subarray multiplexers 144. Further, in some embodiments, the subarray multiplexers 144 and the port multiplexers 146 are controlled by the control signals 136. For example, the control signals 136 may comprise individual select signals for the subarray multiplexers 144 and the port multiplexers 146.

The R/W circuits 142 are configured to read from and/or write to accessed memory cells corresponding to the selected pairs of CBLs (e.g., $BL_{2,TP,B}/BL'_{2,TP,B}$) based on R/W signals 148. The R/W signals 148 correspond to the ports and identify whether to perform a read or write operation on the corresponding ports. Further, for clarity, the R/W signals 148 are labeled as $R/W_{<port>}$. In some embodiments, the R/W circuits 142 are further configured to output data read from accessed memory cells to the data signals 132 and/or to write data input on the data signals 132 to accessed memory cells. The R/W circuits 142 are controlled by the controller 134, and respectively comprise circuitry for reading from and writing to the selected pairs of CBLs. The controller 134 may, for example, be configured to generate the control signals 136 to control the R/W circuits 142 based on the R/W signals 148.

To read data from the selected pairs of CBLs, in some embodiments, the R/W circuits 142 comprise respective sense amplifiers (not shown). The sense amplifiers are configured to detect differential biases driven to the selected pairs of CBLs by memory cells accessed by the word lines 112. The differential biases represent the internal data states of the memory cells (e.g., $MC_{1,M}$ and $MC_{2,M}$) accessed by the word lines 112 (e.g., $WL_{M,A}$). For example, a first differential bias may correspond to a logical "1", whereas a second differential bias may correspond to a logical "0". Further, the sense amplifiers are configured to latch or otherwise store data values of the differential biases. To write data to the selected pairs of CBLs, in some embodiments, the R/W circuits 142 comprise respective differential drivers (not shown). The differential drivers are configured to drive differential biases onto the selected pairs of CBLs. The differential biases represent data states to be stored in memory cells accessed by the word lines 112, and overwrite the internal data states of the memory cells. The differential biases may, for example, correspond to bits of the data signals 132.

In some embodiments, the data signals 132 pass to the I/O array 130 through a column decoder 150. For example, where Z (i.e., the number of bits carried on each of the data signals 132) is less than X (i.e., the number of columns of the memory cell array 104), the data signals 132 may pass to the I/O array 130 through the column decoder 150. The column decoder 150 is configured to electrically couple the data signals 132 to the I/O cells 138 corresponding to the Y-bit addresses on the address signals 116. Further, the column decoder 150 is configured to electrically couple the data signals 132 to the I/O cells 138, such that bits of the data signals 132 are respectively mapped to the I/O cells 138 with a one-to-one mapping. For example, where a Y-bit address on the address signal for port A (e.g., $ADDR_A$) identifies columns 1 through X, the data signal for port A (e.g., $DATA_A$) has X bits that are respectively mapped to the I/O cells at columns 1 through X (e.g., $I/O_1$ to $I/O_X$).

The controller 134 is configured to control the I/O array 130 and, in some embodiments, the row decoder 114 and/or the column decoder 150, to perform read and/or write operations on the two ports. Further, as noted above, two read and/or write operations can be performed at the same time or at nearly the same time using the two ports. For example, a first row of memory cells (e.g., memory cells $MC_{1,1}$ through $M_{X,1}$) may be accessed through a port A word line (e.g., $WL_{1,A}$), while a (M+1)th row of the memory cells (e.g., memory cells $MC_{1,M+1}$ through $MC_{X,M+1}$) may be concurrently accessed through a port B word line (e.g., $WL_{M+1,B}$). Thereafter, while accessing the memory cells of the first row, top bit lines of port A (e.g., $BL_{1,TP,A}/BL'_{1,TP,A}$ to $BL_{X,TP,A}/BL'_{X,TP,A}$) may be used to read from or write to the first row of accessed memory cells. Similarly, while accessing the memory cells of the (M+1)th row, bottom bit lines of port B (e.g., $BL_{1,BT,B}/BL'_{1,BT,B}$ to $BL_{X,BT,B}/BL'_{X,BT,B}$) may be used to concurrently read from or write to the (M+1)th row of accessed memory cells.

As a more detailed example, suppose a write operation through port A to a first row of memory cells, and further suppose a read operation through port B to a (M+1)th row of the memory cells is concurrently performed with the write operation. To write data through port A to a first row of memory cells (e.g., memory cells $MC_{1,1}$ through $M_{X,1}$), the R/W signal for port A (e.g., $R/W_A$) is provided to the DP SRAM device 102 in a first state (e.g., a logical "0") that indicates a write operation is to take place. Further, a data signal for port A (e.g., $DATA_A$) is provided to the DP SRAM device 102 with a first Z-bit data value, and an address signal for port A (e.g., $ADDR_A$) is provided to the DP SRAM device 102 with a first Y-bit address that identifies Z consecutive memory cells in the first row.

Upon receiving the port A signals, the row decoder 114 enables a port A word line (e.g., $WL_{1,A}$) corresponding to the first Y-bit address, and the column decoder 150 electrically couples the data signal for port A to the one or more I/O cells (e.g., $I/O_1$ to $I/O_X$) corresponding to the first Y-bit address. Further, the controller 134 controls the I/O array 130 to select the one or more port A pairs of CBLs (e.g., $BL_{1,TP,1}/BL'_{1,TP,A}$ to $BL_{X,TP,A}/BL'_{X,TP,A}$) corresponding to the first Y-bit address, and enables write circuitry in the I/O array 130. This, in turn, applies differential biases respectively to the port A pair(s) of CBLs to write the first Z-bit data value to the Z consecutive memory cells in the first row.

At the same time that data is being written to the first row through port A, data can be concurrently read from a (M+1)th row of memory cells (e.g., memory cells $MC_{1,M+1}$ through $MC_{X,M+1}$). The R/W signal for port B (e.g., $R/W_B$) is provided to the DP SRAM device 102 in a second state (e.g., a logical "1") that indicates a read operation is to take place. Further, an address signal for port B (e.g., $ADDR_B$) is provided to the DP SRAM device 102 with a second Y-bit address that identifies Z consecutive memory cells in the (M+1)th row. Based on the port B signals, the column decoder 150 electrically couples the data signal for port B (e.g., $DATA_B$) to the one or more I/O cells (e.g., $I/O_1$ to $I/O_X$) corresponding to the second Y-bit address. Further, the controller 134 controls the I/O array 130 to select the one or more port B pairs of CBLs (e.g., $BL_{1,BT,B}/BL'_{1,BT,B}$ to $BL_{X,BT,B}/BL'_{X,BT,B}$) corresponding to the second Y-bit address, and enables read circuitry in the I/O array 130. Even more, the controller 134 may, for example, control the I/O array 130 to float the port B pair(s) of CBLs, and/or to pre-charge the port B pair(s) of CBLs to a voltage level between a logical "0" and a logical "1".

The row decoder 114 and controller 134 then enable a port B word line (e.g., $WL_{M+1,B}$) corresponding to the second Y-bit address. This, in turn, triggers the accessed memory cells (e.g., memory cells $MC_{1,M+1}$ through $MC_{X,M+1}$) to drive differential biases onto respective ones of the port B pair(s) of CBLs, where the differential biases represent internal data states of the accessed memory cells. For example, if memory cell $MC_{1,M+1}$ stores a logical "1" and $MC_{X,M+1}$ stores a logical "0", a first differential bias on $BL_{1,2,B}/BL'_{1,2,B}$ represents a logical "1" and a second, different differential bias on $BL_{X,2,B}/BL'_{X,2,B}$ represents a logical "0". Further, sense amplifiers respectively of the I/O cells 138 then store the corresponding data states on the port B pair(s) of CBLs, and the data states for the Z consecutive memory cells in the (M+1)th row are output as a second Z-bit data value to the data signal for port B (e.g., $DATA_B$).

While the foregoing focused on DP SRAM, it is to be appreciated that other types of dual port semiconductor memory are amenable. Further, while the foregoing focused on one I/O configuration, other I/O configurations are amenable. For example, the I/O array 130 may have a different configuration, such as separate R/W circuits for port A and port B. As another example, the relationship between the row decoder 114, the column decoder 150, the I/O array 130, and the controller 134 may be vary. Even more, while the top and bottom memory cell subarrays 108, 110 were respectively described as "top" and "bottom", the top and bottom memory cell subarrays 108, 110 may alternatively be referred to as a first memory cell subarray and a second memory cell subarray, respectively.

Figure 2A:
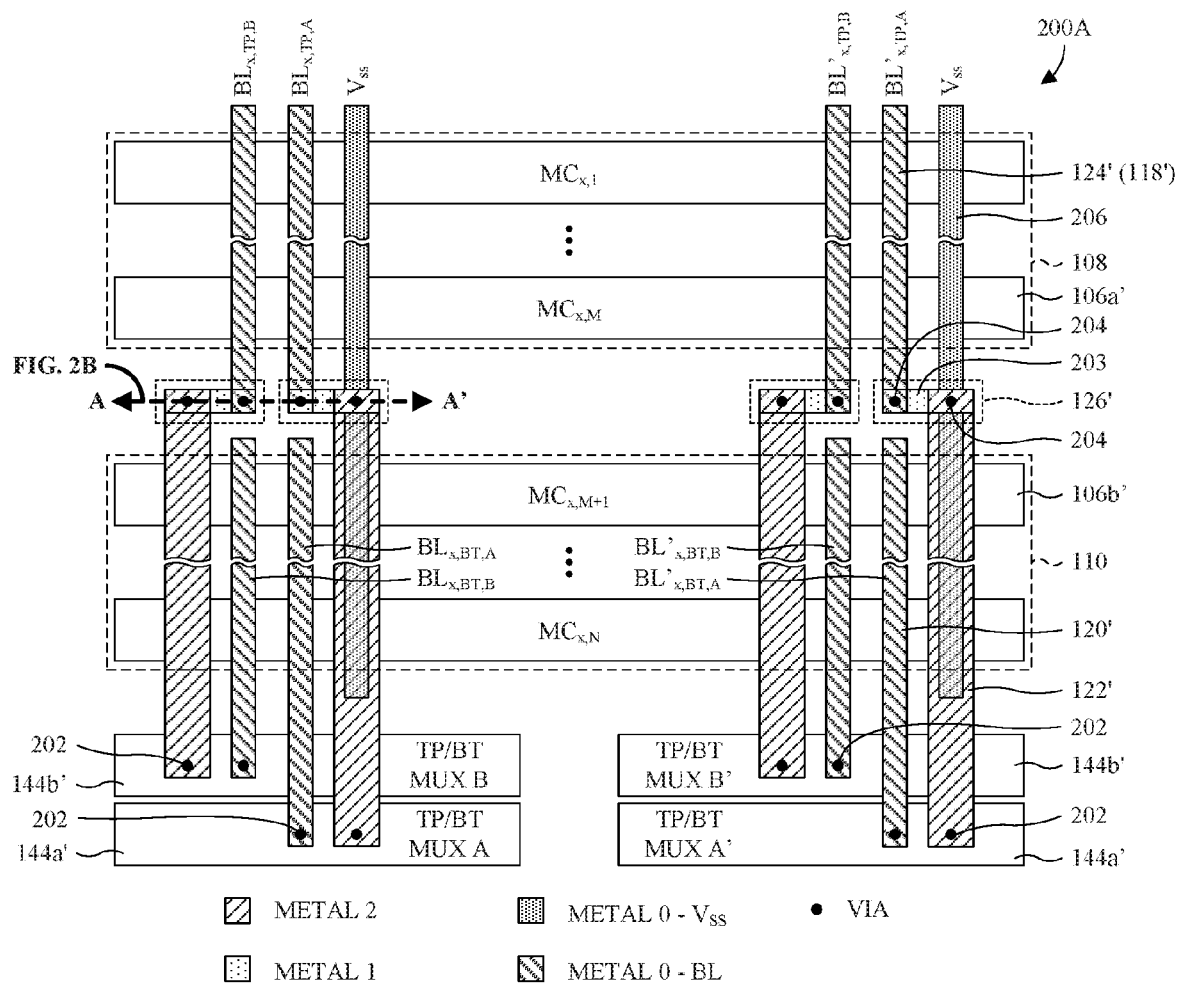
FIG. 2A illustrates a layout view of some embodiments of bit lines within a column of the DP SRAM device of FIG. 1.

With reference to FIG. 2A, a layout view 200A of some embodiments of bit lines 118', 120' within a column of the DP SRAM device 102 of FIG. 1 is provided. The bit lines 118', 120' are representative of bit lines within each column of the DP SRAM device 102 of FIG. 1 and, in keeping with the notation described above, the column is identified by subscript "x", which is an integer value greater than or equal to 1 and less than or equal to X. Further, for clarity, a legend is provided at the bottom of the layout view 200A to identify BEOL metal layers within which various segments of the bit lines 118', 120' may be arranged.

As illustrated by the layout view 200A, the bit lines 118', 120' comprise top bit lines 118' (e.g., $BL_{x,TP,A}/BL'_{x,TP,A}$ and $BL_{x,TP,B}/BL'_{x,TP,B}$) and bottom bit lines 120' (e.g., $BL_{x,BT,A}/BL'_{x,BT,A}$ and $BL_{x,BT,B}/BL'_{x,BT,B}$). The top bit lines 118' extend respectively from subarray multiplexers 144a', 144b' on a first end of the column, laterally along the column, to a second end of the column that is opposite the first end. In some embodiments, the subarray multiplexers 144a', 144b' comprise two subarray multiplexers (e.g., TP/BT MUX B and TP/BT MUX B') for each port. Further, the top bit lines 118' each comprise a fly bit line segment 122', a local bit line segment 124', and a jump cell 126'.

The fly bit line segments 122' of the top bit lines 118' extend along the column, respectively from the subarray multiplexers 144a', 144b', and terminate between a top memory cell subarray 108 and a bottom memory cell subarray 110. Further, the fly bit line segments 122' electrically couple respectively to the subarray multiplexers 144a', 144b' through first vias 202. The local bit line segments 124' of the top bit lines 118' extend from between the top and bottom memory cell subarrays 108, 110, along the column, to the second end of the column. Further, the local bit line segments 124' electrically couple to memory cells 106a' of the top memory cell subarray 108 (e.g., $MC_{x,1}$ to $MC_{x,M}$) that are in the column.

In some embodiments, the fly bit line segments 122' and the local bit line segments 124' extend along the column in the same metal layer of a BEOL interconnect structure. In alternative embodiments, the fly bit line segments 122' and the local bit line segments 124' extend along the column in different metal layers of a BEOL interconnect structure. For example, the fly bit line segments 122' may extend along the column in a metal 2 layer of a BEOL interconnect structure, whereas the local bit line segments 124' may extend along the column in a metal 0 layer of the BEOL interconnect structure. As another example, the fly bit line segments 122' may extend along the column in a metal 0 layer of a BEOL interconnect structure, whereas the local bit line segments 124' may extend along the column in a metal 2 layer of the BEOL interconnect structure.

The jump cells 126' of the top bit lines 118' are between the top and bottom memory cell subarrays 108, 110 and electrically couple the fly bit line segments 122' respectively to the local bit line segments 124'. The jump cells 126' each comprise a transition bit line segment 203 and second vias 204. The transition bit line segments 203 extend laterally at an angle to the column (e.g., substantially orthogonal to the column), respectively from ends of the fly bit line segments 122' respectively to ends of the local bit line segments 124'. Further, the transition bit line segments 203 electrically couple to the fly bit line segments 122' and the local bit line segments 124' through the second vias 204. In some embodiments, the transition bit line segments 203 are vertically spaced between a first metal layer of a BEOL interconnect structure that accommodate the fly bit line segments 122' and a second metal layer of the BEOL interconnect structure that accommodates the local bit line segments 124'. For example, the transition bit line segments 203 may be in a metal 1 layer of a BEOL interconnect structure when the fly bit line segments 122' are in a metal 2 layer of the BEOL interconnect structure and the local bit line segments 124' are in a metal 0 layer of the BEOL interconnect structure.

The bottom bit lines 120' extend laterally along the column, respectively from the subarray multiplexers 144a', 144b', and terminate between the top and bottom memory cell subarrays 108, 110. Further, the bottom bit lines 120' electrically couple respectively to the subarray multiplexers 144a', 144b' through the first vias 202, and electrically couple to memory cells 106b' of the bottom memory cell subarray 110 that are in the column (e.g., $MC_{x,M+1}$ and $MC_{x,N}$). Even more, in some embodiments, the bottom bit lines 120' extend laterally in the same or a different metal layer of a BEOL interconnect structure as the local bit line segments 124'. For example, the bottom bit lines 120' and the local bit line segments 124' may extend laterally in a metal 0 layer of a BEOL interconnect structure. As another example, the bottom bit lines 120' may extend laterally in a metal 2 layer of a BEOL interconnect structure, whereas the local bit line segments 124' may extend laterally in a metal 0 layer of a BEOL interconnect structure.

Also illustrated by the layout view 200A, one or more voltage source source ($V_{ss}$) lines 206 extend laterally from the first end of the column to the second end of the column, and electrically couple with the memory cells 106a', 106b' of the column (e.g., $MC_{x,1}$ to $MC_{x,N}$). In some embodiments, the $V_{ss}$ line(s) 206 extend laterally in a metal 0 layer of a BEOL interconnect structure and/or are overlapped by fly bit line segments (e.g., the fly bit line segments of $BL_{x,TP,A}$ and $BL'_{x,TP,A}$). Alternatively, in other embodiments, the $V_{ss}$ line(s) 206 extend laterally in a metal 2 layer of a BEOL interconnect structure and/or overlap fly bit line segments (e.g., the fly bit line segments of $BL_{x,TP,A}$ and $BL'_{x,TP,A}$). In some other embodiments, the $V_{ss}$ line(s) 206 are more generally power and/or ground lines.

Figure 2B:
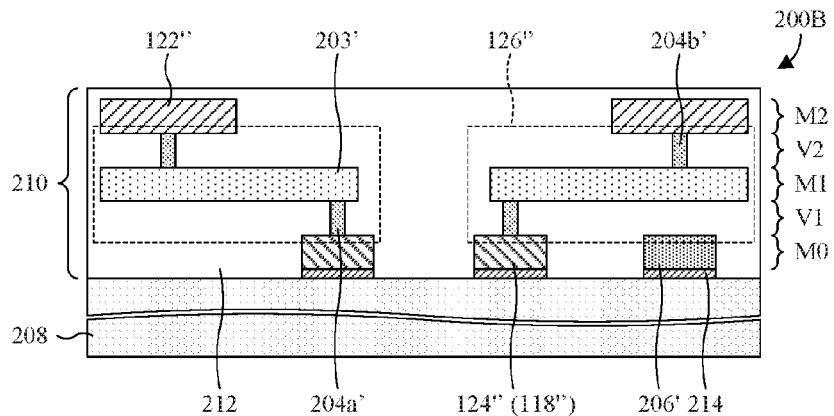
FIG. 2B illustrates a cross-sectional view of some embodiments of jump cells within the column of FIG. 2A.

With reference to FIG. 2B, a cross-sectional view 200B of some embodiments of jump cells 126'' within the column of FIG. 2A is provided. The cross-sectional view 200B may, for example, be taken along line A-A' in FIG. 2A, and the jump cells 126'' are representative of the jump cells 126' within the column of FIG. 2A. As illustrated, a semiconductor substrate 208 supports a BEOL interconnect structure 210 and the memory cells 106a', 106b' of FIG. 2A (not shown). The semiconductor substrate 208 may be, for example, a bulk semiconductor substrate (e.g., a bulk silicon substrate) or a silicon-on-insulator (SOI) substrate. The BEOL interconnect structure 210 comprises a first dielectric layer 212 within which a plurality of metal layers M0, M1, M2 are alternatingly stacked with a plurality of via layers V1, V2. Further, in some embodiments, the BEOL interconnect structure 210 comprises a second dielectric layer 214 spacing a metal 0 layer (i.e., M0) from the semiconductor substrate 208.

The metal layers M0, M1, M2 and the via layers V1, V2 define a set of top bit lines 118'' (e.g., $BL_{x,TP,A}$ and $BL_{x,TP,B}$ in FIG. 2A) respectively for port A and port B. The top bit lines 118'' each comprise a fly bit line segment 122'', a transition bit line segment 203', and a local bit line segment 124''. The fly bit line segment 122'' and the local bit line segment 124'' are in different metal layers, and the transition bit line segment 203' is in a metal layer between these different metal layers. For example, the fly bit line segment 122'' may be in a metal 2 layer (i.e., M2), the transition bit line segment 203' may be in a metal 1 layer (i.e., M1), and the local bit line segment 124'' may be in a metal 0 layer (i.e., M0). As another example, the fly bit line segment 122'' may be in in the metal 2 layer, the transition bit line segment 203' may be in the metal 1 layer, and the local bit line segment 124'' may be in the metal 0 layer. Further, the top bit lines 118'' each comprise a first via 204a' and a second via 204b'. The first via 204a' electrically couples the local bit line segment 124'' to the transition bit line segment 203' in, for example, a via 1 layer (i.e., V1). The second via 204b' electrically coupling the transition bit line segment 203' to the fly bit line segment 122'' in, for example, a via 2 layer (i.e., V2). In some embodiments, the metal layers further define a $V_{ss}$ line 206' crossing under one of the transition bit line segments 203' in, for example, the metal 0 layer.

Figure 3A:
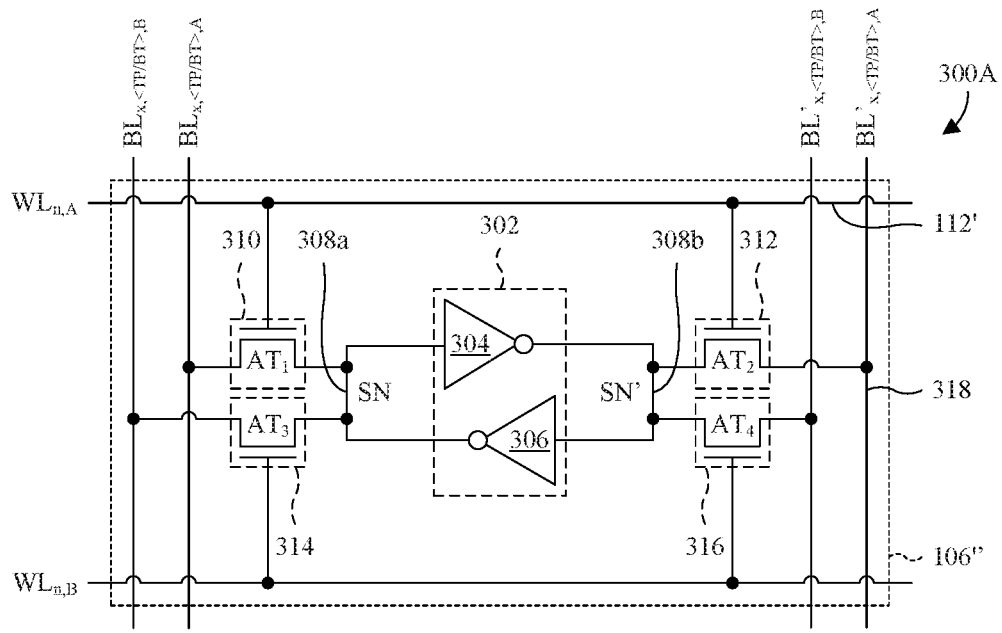
FIG. 3A illustrates a schematic view of some embodiments of a memory cell within the DP SRAM device of FIG. 1.

With reference to FIG. 3A, a schematic view 300A of some embodiments of a memory cell 106'' within the DP SRAM device 102 of FIG. 1 is provided. The memory cell 106'' is representative of each memory cell within the DP SRAM device 102 of FIG. 1 and, in keeping with the notation described above, a column of the memory cell 106'' and a row of the memory cell 106'' are respectively identified by subscript "x" and subscript "n". "x" is an integer value greater than or equal to 1 and less than or equal to X, and "n" is an integer value greater than or equal to 1 and less than or equal to N. Further, subscript "<TP/BT>" represents whether the memory cell 106" is in the top or bottom memory cell subarray 108, 110 of FIG. 1.

As illustrated, the memory cell 106" includes a data storage element 302 made up of a first inverter 304 and a second inverter 306. The first and second inverters 304, 306 are cross-coupled to one another to establish a first data storage node 308a (SN) and a second data storage node 308b (SN'). The first and second data storage nodes 308a, 308b are complementary. One data storage node is biased to carry a first voltage corresponding to a logical "1", while the other data storage node is biased to carry a second voltage corresponding to a logical "0". Thus, the first and second inverters 304, 306 store a bit of data in a mutually reinforcing fashion.

Several access transistors 310, 312, 314, 316 selectively couple the first and second data storage nodes 308a, 308b respectively to bit lines 318 (e.g., $BL_{x,<TP/BT>,A}$ and $BL'_{x,<TP/BT>,A}$), based on whether word lines 112' (e.g., $WL_{n,A}$ and $WL_{n,B}$) are enabled, thereby allowing data to be selectively read from and/or written to the data storage element 302. Depending upon where the memory cell 106" is located within the DP SRAM device 102 of FIG. 1, the bit lines 318 may correspond to the top bit lines 118 of FIG. 1 or the bottom bit lines 120 of FIG. 1.

With regard to port A, a first access transistor 310 ($AT_1$) is electrically coupled to the first data storage node 308a, and a second access transistor 312 ($AT_2$) is electrically coupled to the second data storage node 308b. The first access transistor 310 selectively couples the first data storage node 308a to bit line $BL_{x,<TP/BT>,A}$ based on a voltage of word line $WL_{n,A}$, whereas the second access transistor 312 selectively couples the second data storage node 308b to bit line $BL'_{x,<TP/BT>,A}$ based on the voltage of word line $WL_{n,A}$. Bit lines $BL_{x,<TP/BT>,A}$ and $BL'_{x,<TP/BT>,A}$ are complementary and thus form a CBL pair. With regard to port B, a third access transistor 314 ($AT_3$) is electrically coupled to the first data storage node 308a, and a fourth access transistor 316 ($AT_4$) is electrically coupled to the second data storage node 308b. The third access transistor 314 selectively couples the first data storage node 308a to bit line $BL_{x,<TP/BT>,B}$ based on a voltage of word line $WL_{n,B}$, whereas the fourth access transistor 316 selectively couples the second data storage node 308b to bit line $BL'_{x,<TP/BT>,B}$ based on the voltage of word line $WL_{n,B}$. Bit lines $BL_{x,<TP/BT>,B}$, $BL'_{x,<TP/BT>,B}$ are complementary and thus form a CBL pair.

Figure 3B:
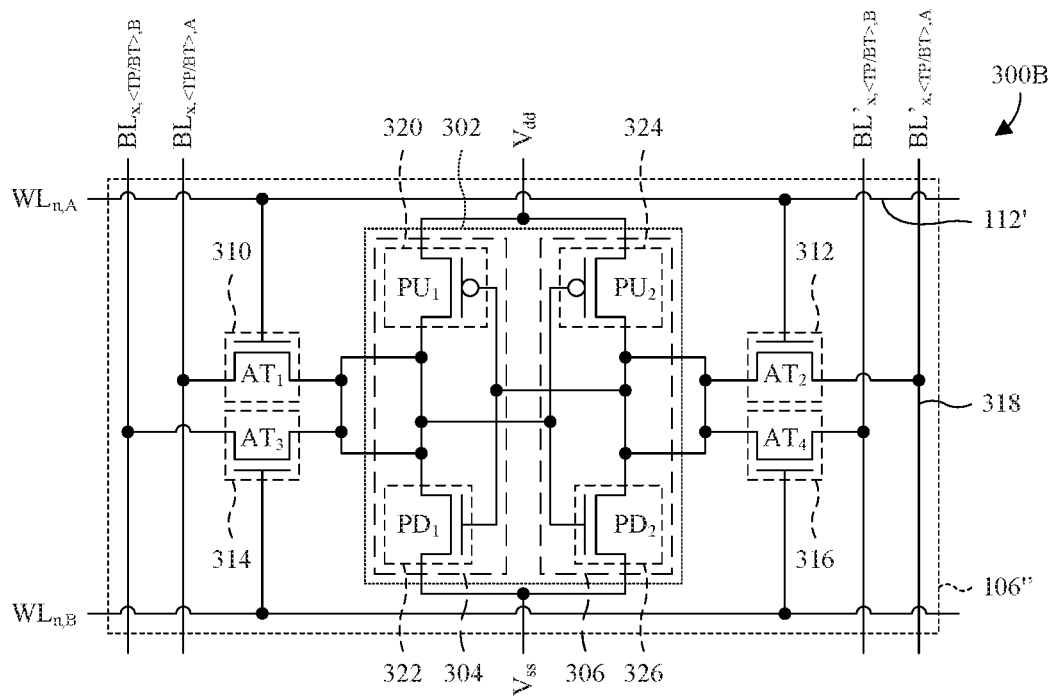
FIG. 3B illustrates a schematic view of some more detailed embodiments of the memory cell of FIG. 3A.

With reference to FIG. 3B, a schematic view 300B of some more detailed embodiments of the memory cell 106" of FIG. 3A is provided. As illustrated, the first inverter 304 includes a first pull-up transistor 320 ($PU_1$) and a first pull-down transistor 322 ($PD_1$). Further, the second inverter 306 includes a second pull-up transistor 324 ($PU_2$) and a second pull-down transistor 326 ($PD_2$).

Figure 4:
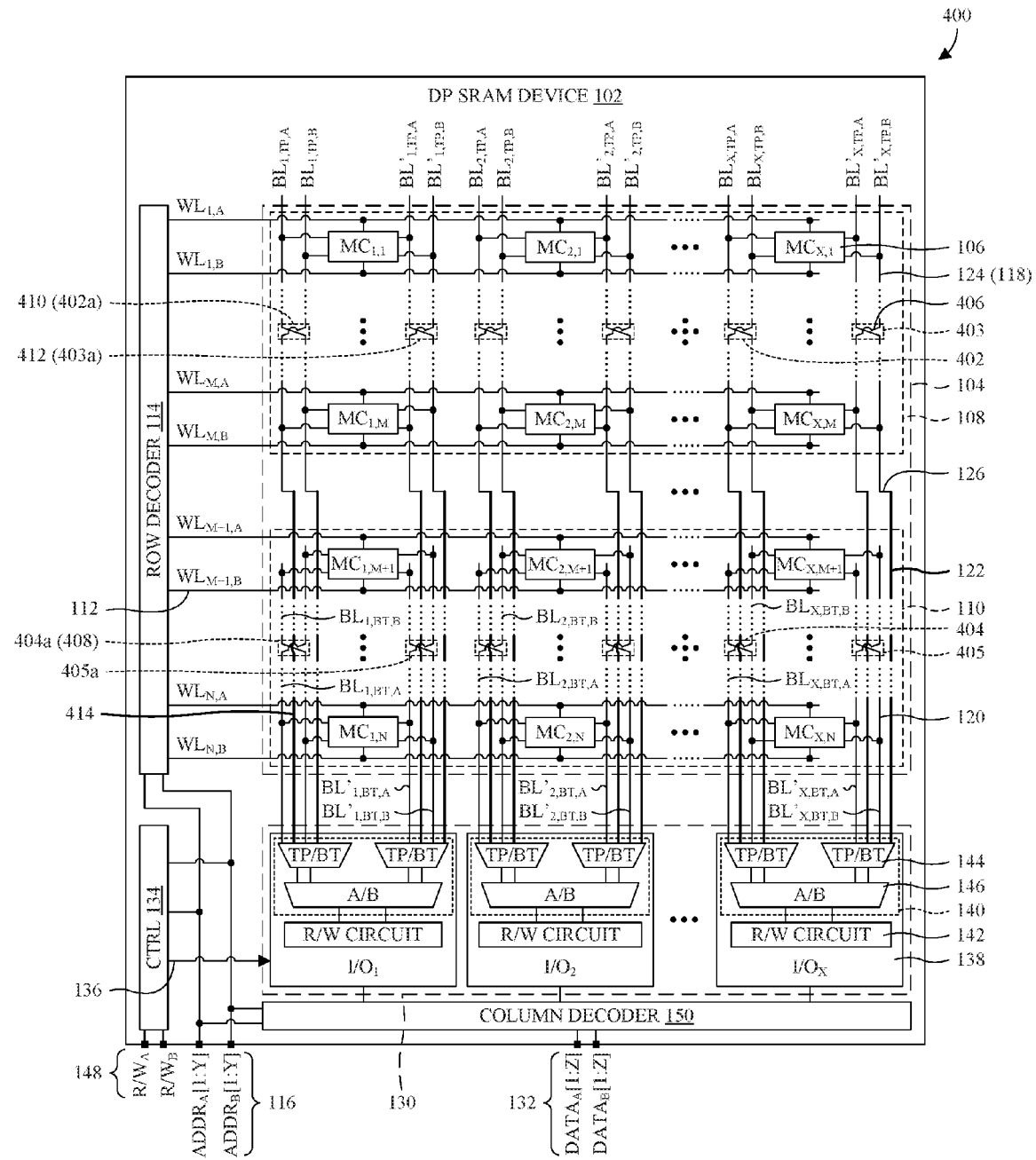
FIG. 4 illustrates a block diagram of some other embodiments of the DP SRAM device of FIG. 1 with twist cells.

With reference to FIG. 4, a block diagram 400 of some other embodiments of the DP SRAM device 102 of FIG. 1 is provided. As illustrated, the top bit lines 118 respectively comprise top twist cells 402, 403 in the top memory cell subarray 108, between row 1 and row M, and the bottom bit lines 120 respectively comprise bottom twist cells 404, 405 in the bottom memory cell subarray 110, between row M+1 and row N. For example, the top twist cells 402, 403 may be half way between row 1 and row M, and/or the bottom twist cells 404, 405 may be half way between row M+1 and row N. The top and bottom twist cells 402, 403, 404, 405 are each configured to twist a pair of neighboring bit lines and are each made up of a pair of cross segments 406, which are discussed and illustrated in detail hereafter.

Twisting a pair of neighboring bit lines (e.g., $BL'_{1,TP,A}$ and $BL'_{1,TP,B}$) comprises crossing a first bit line of the pair (e.g., $BL'_{1,TP,B}$) over a second bit line of the pair (e.g., $BL'_{1,TP,A}$). While not visible in FIG. 4, the first bit line crosses the second bit line spaced from the second bit line in a direction substantially orthogonal to the rows and the columns so as not to contact the second bit line. For example, the first bit line may be in a metal 2 layer of a BEOL interconnect structure and the second bit line may be in a metal 0 layer of the BEOL interconnect structure while the first and second bit lines cross. Further, in some embodiments, twisting a pair of neighboring bit lines (e.g., $BL_{1,BT,A}$ and $BL_{1,BT,B}$) comprises swapping axes along which the bit lines extend. For example, suppose a first bit line (e.g., $BL_{1,BT,A}$) of the pair extends laterally along a first axis, and a second bit line (e.g., $BL_{1,BT,B}$) of the pair extends laterally along a second axes parallel to the first axis, before a twist cell (e.g., a twist cell 408). After the twist cell, the first bit line (e.g., $BL_{1,BT,A}$) may extend laterally along the second axis, and the second bit line (e.g., $BL_{1,BT,B}$) may extend laterally along the first axis.

Advantageously, the top and bottom twist cells 402, 403, 404, 405 facilitate low capacitive coupling between the top and bottom bit lines 118, 120 since the top and bottom twist cells 402, 403, 404, 405 break parallel surfaces of the top and bottom bit lines 118, 120. This, in turn, leads to high capacitive matching between pairs of CBLs (e.g., $BL_{1,TP,A}$/$BL'_{1,TP,A}$), as well as high read and write times and good signal-to-noise margins.

The top twist cells 402, 403 comprise left top twist cells 402 on the left sides of respective columns and right top twist cells 403 on the right sides of respective columns. In some embodiments, the top twist cells 402, 403 comprise a pair of top twist cells 402a, 403a for each column, where the pair comprises a left top twist cell 402a and a right top twist cell 403a. Similarly, the bottom twist cells 404, 405 comprise left bottom twist cells 404 on the left sides of respective columns and right bottom twist cells 405 on the right sides of respective columns. In some embodiments, the bottom twist cells 404, 405 comprise a pair of bottom twist cells 404a, 405a for each column, where the pair comprises a left bottom twist cell 404a and a right bottom twist cell 405a.

In some embodiments, a left twist cell 410 of a twist cell pair (e.g., 402a/403a or 404a/405a) twists port A and B bit lines (e.g., $BL_{1,TP,A}$ and $BL_{1,TP,B}$) neighboring on a left side of a column. The port A and B bit lines neighboring on the left side of the column correspond to the top bit lines 118 for the top twist cells 402, 403, and correspond to the bottom bit lines 120 for the bottom twist cells 404, 405. A right twist cell 412 of the twist cell pair twists port A and B bit lines (e.g., $BL'_{1,TP,A}$ and $BL'_{1,TP,B}$) that neighbor on the right side of the column, and that are complementary to the port A and B bit lines neighboring on the left side of the column. Similar to the left twist cell 410, the port A and B bit lines neighboring on the right side of the column correspond to the top bit lines 118 for the top twist cells 402, 403, and correspond to the bottom bit lines 120 for the bottom twist cells 404, 405.

A fly bit line segment 414 is laterally spaced between the neighboring bit lines (e.g., $BL'_{1,BT,A}$ and $BL'_{1,BT,B}$) of each of the bottom twist cells 404, 405. For example, suppose a first bit line (e.g., $BL_{1,BT,A}$) of a twist cell (e.g., a twist cell 408) extends laterally along a first axis, and a second bit line (e.g., $BL_{1,BT,B}$) of the twist cell extends laterally along a second axis parallel to the first axis. In this example, the fly bit line segment 414 may extend laterally along a third axis that is parallel to the first and second axes, and that is laterally spaced between the first and second axes. In some embodiments, while not visible in FIG. 4, the fly bit line segment 414 is further spaced from the bottom twist cells 404, 405 in a direction substantially orthogonal to the rows and the columns of the memory cell array 104 such that the fly bit line segment 414 "flies" over the bottom twist cells 404, 405.

Figure 5A:
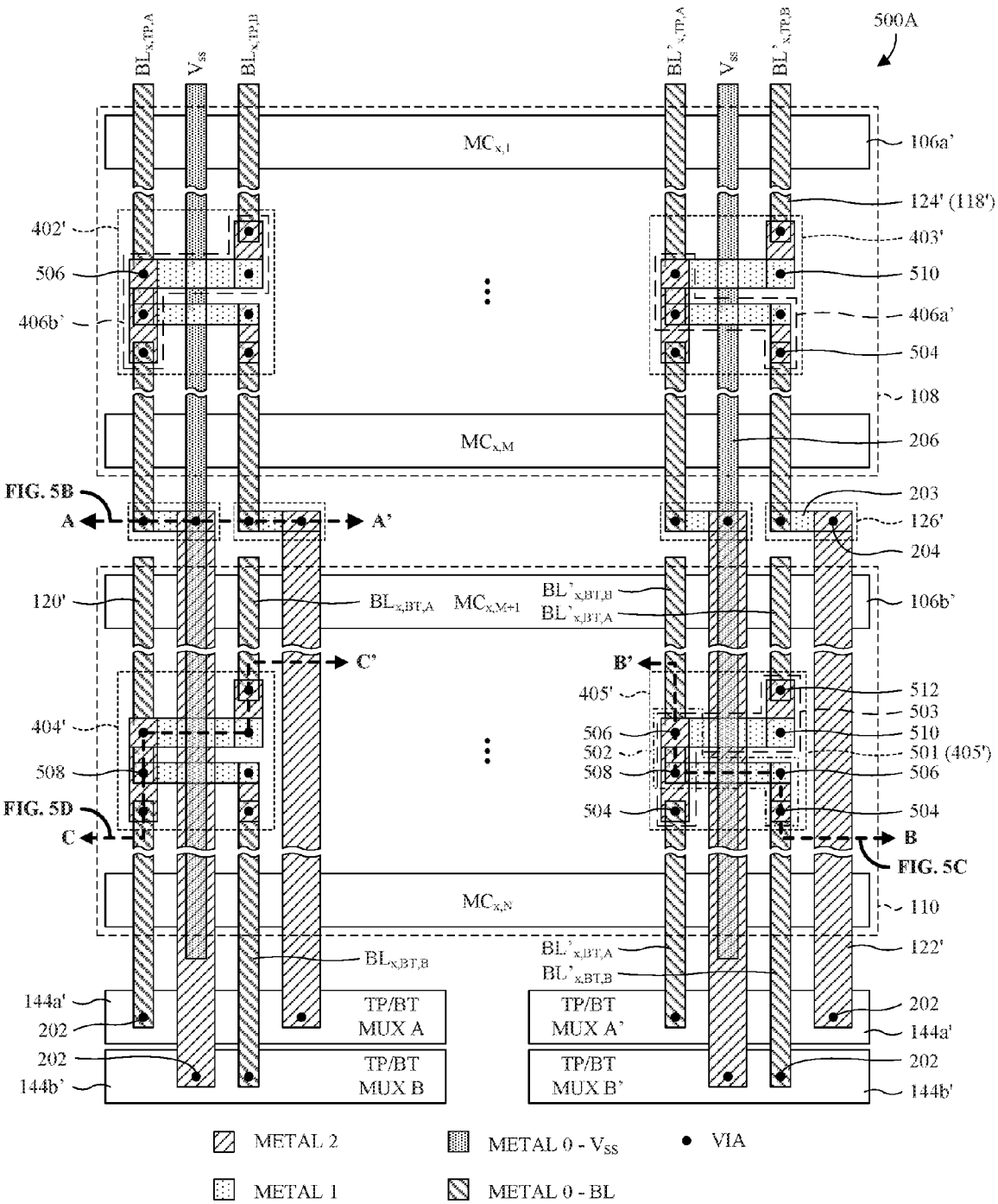
FIG. 5A illustrates a layout view of some embodiments of bit lines within a column of the DP SRAM device of FIG. 4.

With reference to FIG. 5A, a layout view 500A of some embodiments of bit lines 118', 120' within a column of the DP SRAM device 102 of FIG. 4 is provided. As illustrated, FIG. 5A is a variant of FIG. 2A in which top bit lines 118' comprise top twist cells 402', 403' over a top memory cell subarray 108, and in which bottom bit lines 120' comprise bottom twist cells 404', 405' over a bottom memory cell subarray 110. The top and bottom twist cells 402', 403', 404', 405' are each configured to twist a pair of neighboring bit lines (e.g., $BL'_{x,TP,A}$ and $BL'_{x,TP,B}$), which comprises a port A bit line and a port B bit line neighboring the port A bit line. Further, the top and bottom twist cells 402', 403', 404', 405' are each made up of a cross under segment 406a' and a cross over segment 406b'. The cross under segment 406a' is a segment of a first bit line (e.g., $BL'_{x,BT,B}$) in the pair of neighboring bit lines that crosses under a second bit line (e.g., $BL'_{x,BT,A}$) in the pair of neighboring bit lines, and the cross over segment 406b' is a segment of the second bit line that crosses over the first bit line.

In some embodiments, each pair of neighboring bit lines (e.g., $BL'_{x,BT,A}$ and $BL'_{x,BT,B}$) twisted by the top and bottom twist cells 402', 403', 404', 405' extends laterally in a metal 0 layer of a BEOL interconnect structure to a respective twist cell (e.g., a twist cell 501). At the twist cell, the neighboring bit lines cross respectively through a cross under segment (e.g., a cross under segment 502) and a cross over segment (e.g., a cross over segment 503).

For example, the neighboring bit lines (e.g., $BL'_{x,BT,A}$ and $BL'_{x,BT,B}$) step up from the metal 0 layer to a metal 2 layer of the BEOL interconnect structure through first vias 504, and extend laterally along the column in the metal 2 layer. A first bit line (e.g., $BL'_{x,BT,A}$) of the neighboring bit lines extends past a second bit line (e.g., $BL'_{x,BT,B}$) of the neighboring bit lines in the metal 2 layer, and the neighboring bit lines subsequently step down to a metal 1 layer of the BEOL interconnect structure through second vias 506. Within the metal 1 layer, the first bit line (e.g., $BL'_{x,BT,A}$) extends laterally towards the second bit line, and vice versa. After extending towards the first bit line, the second bit line (e.g., $BL'_{x,BT,B}$) steps down to the metal 0 layer through a third via 508 and extends along the column in the metal 0 layer. On the other hand, the first bit line (e.g., $BL'_{x,BT,A}$) steps up to the metal 2 layer through a fourth via 510 after extending towards the second bit line. Further, the first bit line extends laterally along the column in the metal 2 layer. Subsequently, the first bit line steps down to the metal 0 layer through a fifth via 512 and extends along the column in the metal 0 layer.

While the foregoing example describes a specific embodiment of the top and bottom twist cells 402', 403', 404', 405', it is to be understood that other embodiments of the top and bottom twist cells 402', 403', 404', 405' are amenable. For example, whereas the neighboring bit lines crossed respectively in the metal 0 layer and the metal 2 layer in the above example, the neighboring bit lines may cross in other metal layers.

Further, in some embodiments, each of the bottom twist cells 404', 405' has one of the fly bit line segments 122' (e.g., the fly bit line segment of $BL'_{x,TP,B}$) laterally spaced between the neighboring bit lines (e.g., $BL'_{x,BT,A}$ and $BL'_{x,BT,B}$) of the bottom twist cell, and/or each of the top and bottom twist cells 402', 403', 404', 405' has one of the $V_{ss}$ line(s) 206 laterally spaced between the neighboring bit lines (e.g., $BL'_{x,TP,A}$ and $BL'_{x,TP,B}$) of the twist cell. In some embodiments, the fly bit line segments 122' extend laterally in a metal 2 layer of a BEOL interconnect structure, such that the fly bit line segments 122' "fly" over the bottom twist cells 404', 405'. Further, in some embodiments, the $V_{ss}$ line(s) 206 extend laterally in a metal 0 layer of a BEOL interconnect structure, such that the $V_{ss}$ line(s) 206 underlie the top and bottom twist cells 402', 403', 404', 405' and/or underlie the fly bit line segments 122'. Alternatively, in other embodiments, the fly bit line segments 122' are in the metal 0 layer and the $V_{ss}$ line(s) 206 are in the metal 2 layer, such that the $V_{ss}$ line(s) 206 overlie the fly bit line segments 122'.

Figure 5B:
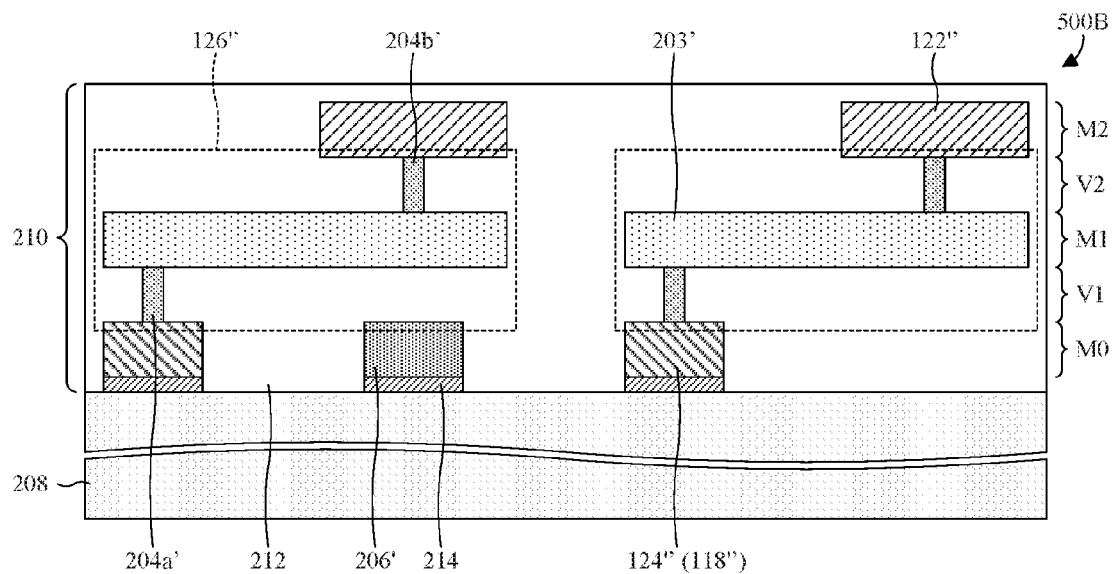
FIG. 5B illustrates a cross-sectional view of some embodiments of jump cells within the column of FIG. 5A.

With reference to FIG. 5B, a cross-sectional view 500B of some embodiments of jump cells 126" within the column of FIG. 5A is provided. The cross-sectional view 500B may, for example, be taken along line A-A' in FIG. 5A, and the jump cells 126" are representative of the jump cells 126' within the column of FIG. 5A. As illustrated, FIG. 5B is a variant of FIG. 2B in which the jump cells 126" are configured to integrate with the top and bottom twist cells 402', 403', 404', 405' of FIG. 5A.

Figure 5C:
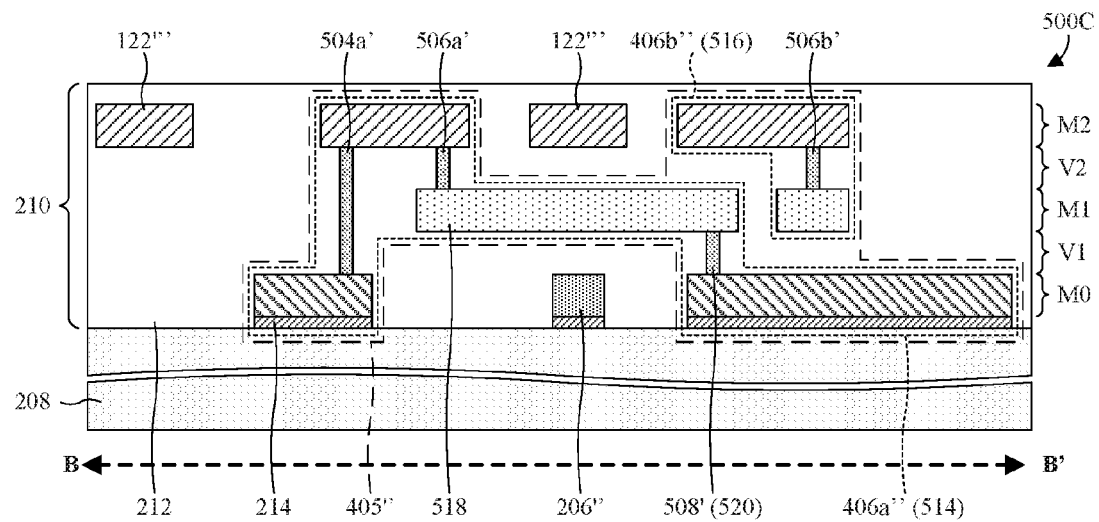
FIG. 5C illustrates a cross-sectional view of some embodiments of a twist cell within the column of FIG. 5A.

With reference to FIG. 5C, a cross-sectional view 500C of some embodiments of a bottom twist cell 405" within the column of FIG. 5A is provided. The bottom twist cell 405" is representative of each of the bottom twist cells 404', 405' within the column of FIG. 5A, as well as each of the top twist cells 402', 403' within the column of FIG. 5A by omitting fly bit line segments 122'''. Further, the cross-sectional view 500C may, for example, be taken along line B-B' in FIG. 5A, which extends along a cross under segment 406a" of the bottom twist cell 405". As illustrated, metal layers M0, M1, M2 and via layers V1, V2 of a BEOL interconnect structure 210 are stacked to define the bottom twist cell 405". The bottom twist cell 405" comprises cross under segment 406a" and a cross over segment 406b".

The cross under segment 406a" is part of a first bit line 514 (e.g., $BL'_{x,BT,B}$ of FIG. 5A), and the cross over segment 406b" is part of a second bit line 516 (e.g., $BL'_{x,BT,A}$ of FIG. 5A). Further, the cross under segment 406a" and the cross over segment 406b" are made up of a plurality of metal lines 518 and vias 520. The cross under segment 406a" crosses under the second bit line 516, and the cross over segment 406b" crosses over first bit line 514, to cross the first and second bit lines 514, 516. Further, in some embodiments, the cross under segment 406a" crosses over a $V_{ss}$ line 206" and/or crosses under one of the fly bit line segments 122'''.

In some embodiments, the cross under segment 406a" steps up from a metal 0 layer (i.e., M0) to a metal 2 layer (i.e., M2) through a first via 504a' spanning a via 1 layer (i.e., V1) and a via 2 layer (i.e., V2), and then steps down to a metal 1 layer (i.e., M1) through a second via 506a' in the via 2 layer. At the metal 1 layer, the cross under segment 406a" crosses over the $V_{ss}$ line 206", and/or under the one of the fly bit line segments 122''', before stepping back down to the metal 0 layer through a third via 508' in the via 1 layer. Once back down to the metal 0 layer, the cross under segment 406a" passes under the cross over segment 406b". Even more, in some embodiments, the cross over segment 406b" steps down from the metal 2 layer to the metal 1 layer through a fourth via 506b' in the via 2 layer.

Figure 5D:
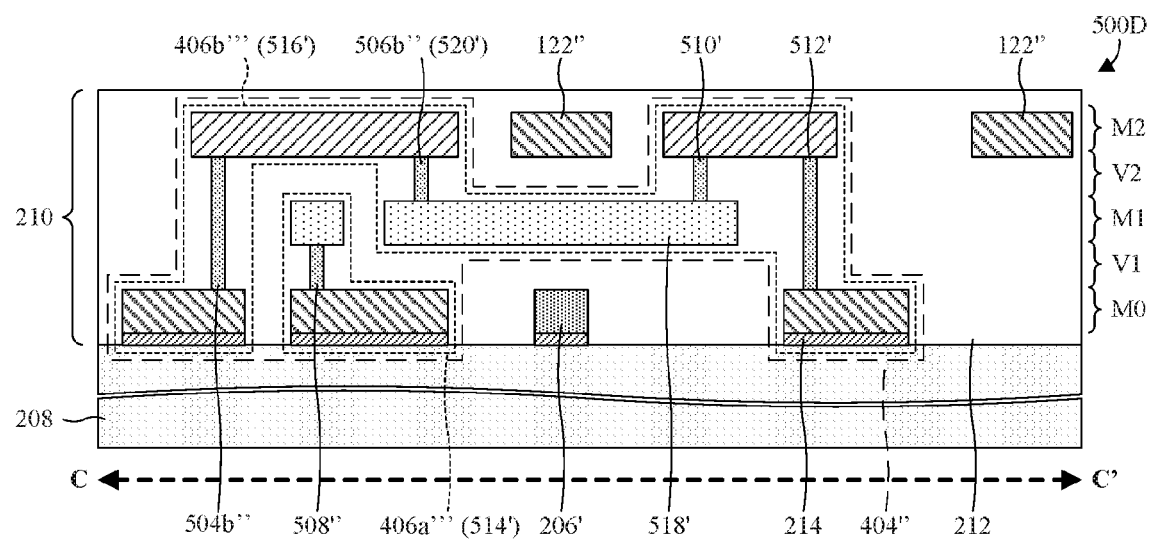
FIG. 5D illustrates another cross-sectional view of some embodiments of a twist cell within the column of FIG. 5A.

With reference to FIG. 5D, another cross-sectional view 500D of some embodiments of a bottom twist cell 404″ within the column of FIG. 5A is provided. The bottom twist cell 404″ is representative of each of the bottom twist cells 404′, 405′ within the column of FIG. 5A, as well as each of the top twist cells 402′, 403′ within the column of FIG. 5A by omitting fly bit line segments 122″. Further, the other cross-sectional view 500D may, for example, be taken along line C-C′ in FIG. 5A, which extends along a cross over segment 406b‴ of the bottom twist cell 404″. As illustrated, metal layers M0, M1, M2 and via layers V1, V2 of a BEOL interconnect structure 210 are stacked to define the bottom twist cell 404″. The bottom twist cell 404″ comprises a cross under segment 406a‴ and the cross over segment 406b‴.

The cross under segment 406a‴ is part of a first bit line 514′ (e.g., $BL_{x,BT,B}$ of FIG. 5A), and the cross over segment 406b‴ is part of a second bit line 516′ (e.g., $BL_{x,BT,A}$ of FIG. 5A). Further, the cross under segment 406a‴ and the cross over segment 406b‴ are made up of a plurality of metal lines 518′ and vias 520′. The cross under segment 406a‴ crosses under the second bit line 516′, and the cross over segment 406b‴ crosses over first bit line 514′, to cross the first and second bit lines 514′, 516′. Further, in some embodiments, the cross over segment 406b‴ crosses over a $V_{ss}$ line 206′ and/or under one of the fly bit line segments 122″.

In some embodiments, the cross over segment 406b‴ steps up from a metal 0 layer (i.e., M0) to a metal 2 layer (i.e., M2) through a first via 504b″ spanning a via 1 layer (i.e., V1) and a via 2 layer (i.e., V2), and then crosses over the cross under segment 406a‴. After crossing over the cross under segment 406a‴, the cross over segment 406b‴ steps down to a metal 1 layer (i.e., M1) through a second via 506b″ in the via 2 layer. At the metal 1 layer, the cross over segment 406b‴ crosses over the $V_{ss}$ line 206′, and/or under the one of the fly bit line segments 122″, before stepping back up to the metal 2 layer through a third via 510′ in the via 2 layer. Once back up to the metal 2 layer, the cross over segment 406b‴ steps down from metal 2 layer to the metal 0 layer through a fourth via 512′ spanning the via 1 layer and the via 2 layer. Further, in some embodiments, the cross under segment 406a‴ steps down from the metal 1 layer to the metal 0 layer through a fifth via 508″ in the via 1 layer.

Figure 6:
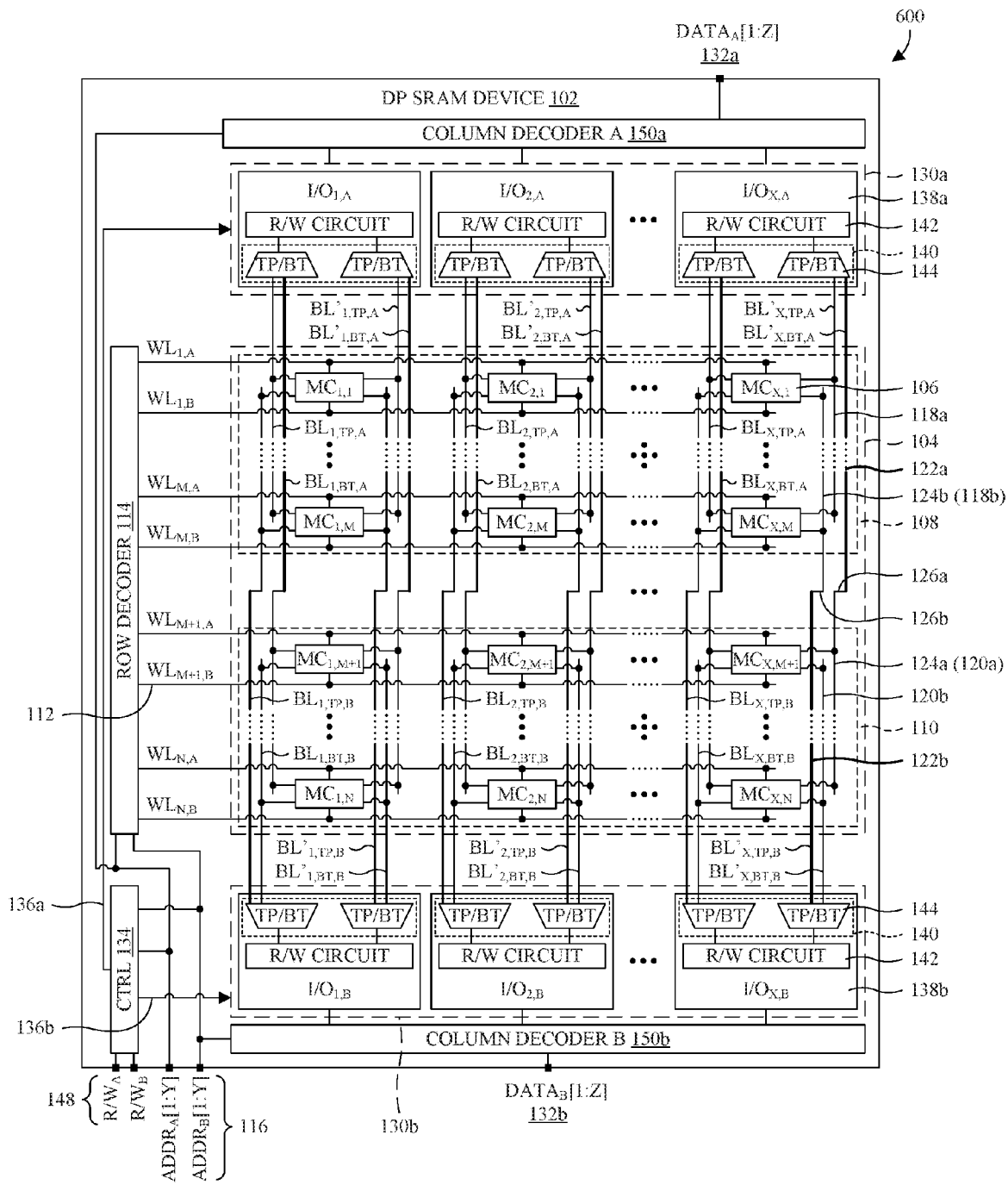
FIG. 6 illustrates a block diagram of some other embodiments of the DP SRAM device of FIG. 1 in which input/output (I/O) is distributed between opposite sides of the DP SRAM device.

With reference to FIG. 6, a block diagram 600 of some other embodiments of the DP SRAM device 102 of FIG. 1 is provided in which I/O is distributed between opposite sides of the DP SRAM device 102. As illustrated, the DP SRAM device 102 comprises a set of top, port A bit lines 118a, a set of top, port B bit lines 118b, a set of bottom, port A bit lines 120a, and a set of bottom, port B bit lines 120b. The top, port A bit lines 118a comprise a pair of CBLs (e.g., $BL_{X,TP,A}/BL'_{X,TP,A}$) for each column, and the top, port B bit lines 118b comprise a pair of CBLs (e.g., $BL_{X,TP,B}/BL'_{X,TP,B}$) for each column. Similarly, the bottom, port A bit lines 120a comprise a pair of CBLs (e.g., $BL_{X,BT,A}/BL'_{X,BT,A}$) for each column, and the bottom, port B bit lines 120b comprise a pair of CBLs (e.g., $BL_{X,BT,B}/BL'_{X,BT,B}$) for each column.

The bottom, port A bit lines 120a electrically couple with memory cells (e.g., $MC_{2,M+1}$ or $MC_{X,N}$) of the bottom memory cell subarray 110 that are in respective columns. Further, the bottom, port A bit lines 120a each comprise a port A fly bit line segment 122a, a port A local bit line segment 124a, and a port A jump cell 126a. The port A fly bit line segments 122a extend along respective columns, from a first side of the memory cell array 104, and terminate between the top and bottom memory cell subarrays 108, 110. The port A local bit line segments 124a extend from between the top and bottom memory cell subarrays 108, 110, along respective columns, to a second side of the memory cell array 104 that is opposite the first side. The port A jump cells 126a are between the top and bottom memory cell subarrays 108, 110, and electrically couple the port A fly bit line segments 122a respectively to the port A local bit line segments 124a.

The top, port B bit lines 118b electrically couple with memory cells (e.g., $MC_{2,1}$ or $MC_{X,M}$) of the top memory cell subarray 108 that are in respective columns. Further, the top, port B bit lines 118b each comprise a port B fly bit line segment 122b, a port B local bit line segment 124b, and a port B jump cell 126b. The port B fly bit line segments 122b extend along respective columns, from the second side of the memory cell array 104, and terminate between the top and bottom memory cell subarrays 108, 110. The port B local bit line segments 124b extend from between the top and bottom memory cell subarrays 108, 110, along the respective columns, to the first side of the memory cell array 104. The port B jump cells 126b are between the top and bottom memory cell subarrays 108, 110, and electrically couple the port B fly bit line segments 122b respectively to the port B local bit line segments 124b.

The top, port A bit lines 118a extend laterally along respective columns, from the first side of the memory cell array 104, and terminate between row M and the port A jump cells 126a. Similarly, the bottom, port B bit lines 120b extend laterally along respective columns, from the second side of the memory cell array 104, and terminate between row M+1 and the port B jump cells 126b. The top, port A bit lines 118a electrically couple with memory cells (e.g., $MC_{X,1}$ or $MC_{2,M}$) of the top memory cell subarray 108 that are in the respective columns, and the bottom, port B bit lines 120b electrically couple with memory cells (e.g., $MC_{X,N}$ or $MC_{1,M+1}$) of the bottom memory cell subarray 110 that are in the respective columns.

A port A I/O array 130a is on the first side of the memory cell array 104 and is configured to use the top, port A bit lines 118a and the bottom, port A bit lines 120a to read from and/or write to memory cells accessed by the word lines 112. In some embodiments, the port A I/O array 130a is configured to output read data respectively to a port A data signal 132a on the first side of the memory cell array 104, and/or to write data from the port A data signal 132a. The port A I/O array 130a is controlled by a controller 134 respectively through port A control signals 136a and comprises a plurality of port A I/O cells 138a.

A port B I/O array 130b is on the second side of the memory cell array 104 and is configured to use the top, port B bit lines 118b and the bottom, port B bit lines 120b to read from and/or write to memory cells accessed by the word lines 112. In some embodiments, the port B I/O array 130b is configured to output read data to a port B data signal 132b on the second side of the memory cell array 104, and/or to write data from the port B data signal 132b. The port B I/O array 130b is controlled by the controller 134 through port B control signals 136b and comprises a plurality of port B I/O cells 138b.

The port A and B I/O cells 138a, 138b correspond to the columns of the memory cell array 104, and are labeled as $I/O_{<column>,<port>}$. Further, the port A and B I/O cells 138a, 138b are electrically coupled with top and bottom bit lines of the corresponding columns. For example, the port A I/O cells 138a are electrically coupled with the top, port A bit lines 118a (e.g., $BL'_{X,TP,A}$) and the bottom, port A bit lines 120a (e.g., $BL_{1,BT,A}$), whereas the port B I/O cells 138b are electrically coupled with the top, port B bit lines 118b (e.g., $BL'_{2,TP,B}$) and the bottom, port B bit lines 120b (e.g., $BL'_{X,BT,B}$). The port A and B I/O cells 138*a*, 138*b* each a comprise selection circuit 140 and a read/write (R/W) circuit 142.

The selection circuits 140 are configured to select pairs of CBLs (e.g., $BL_{1,TP,A}/BL'_{1,TP,A}$) corresponding to Y-bit addresses on address signals 116. In some embodiments, the selection circuits 140 each comprise a pair of subarray multiplexers 144 configured to select between respective top bit lines (i.e., bit lines of the top memory cell subarray 108) and respective bottom bit lines (i.e., bit lines of the bottom memory cell subarray 110). In contrast with the embodiments of FIGS. 1 and 4, port multiplexers (e.g., the port multiplexers 146 of FIGS. 1 and 4) may advantageously be omitted since each port has as an I/O array. The R/W circuits 142 are configured to read from or write to accessed memory cells corresponding to the selected pairs of CBLs based on R/W signals 148 respectively for the ports. Further, in some embodiments, the R/W circuits 142 are configured to output data read from accessed memory cells to the port A and B data signals 132*a*, 132*b*, and/or to write data input on the port A and B data signals 132*a*, 132*b* to accessed memory cells.

In some embodiments, the port A data signals 132*a* pass to the port A I/O arrays 130*a* through a port A column decoder 150*a*, and the port B data signals 132*b* pass to the port B I/O arrays 130*b* through a port B column decoder 150*b*. The port A and B column decoders 150*a*, 150*b* are configured to electrically couple the port A and B data signals 132*a*, 132*b* respectively to the port A and B I/O cells 138*a*, 138*b* corresponding to the Y-bit addresses. For example, where a Y-bit address on the port A address signal (i.e., $ADDR_A$) identifies memory cells in columns 1 through X, the port A column decoder 150*a* may pass bits 1 through X on the port A data signal 132*a* (i.e., $DATA_A$) respectively to the port A I/O cells (e.g., $I/O_{1,A}$ to $I/O_{X,A}$) for columns 1 through X.

Figure 7A:
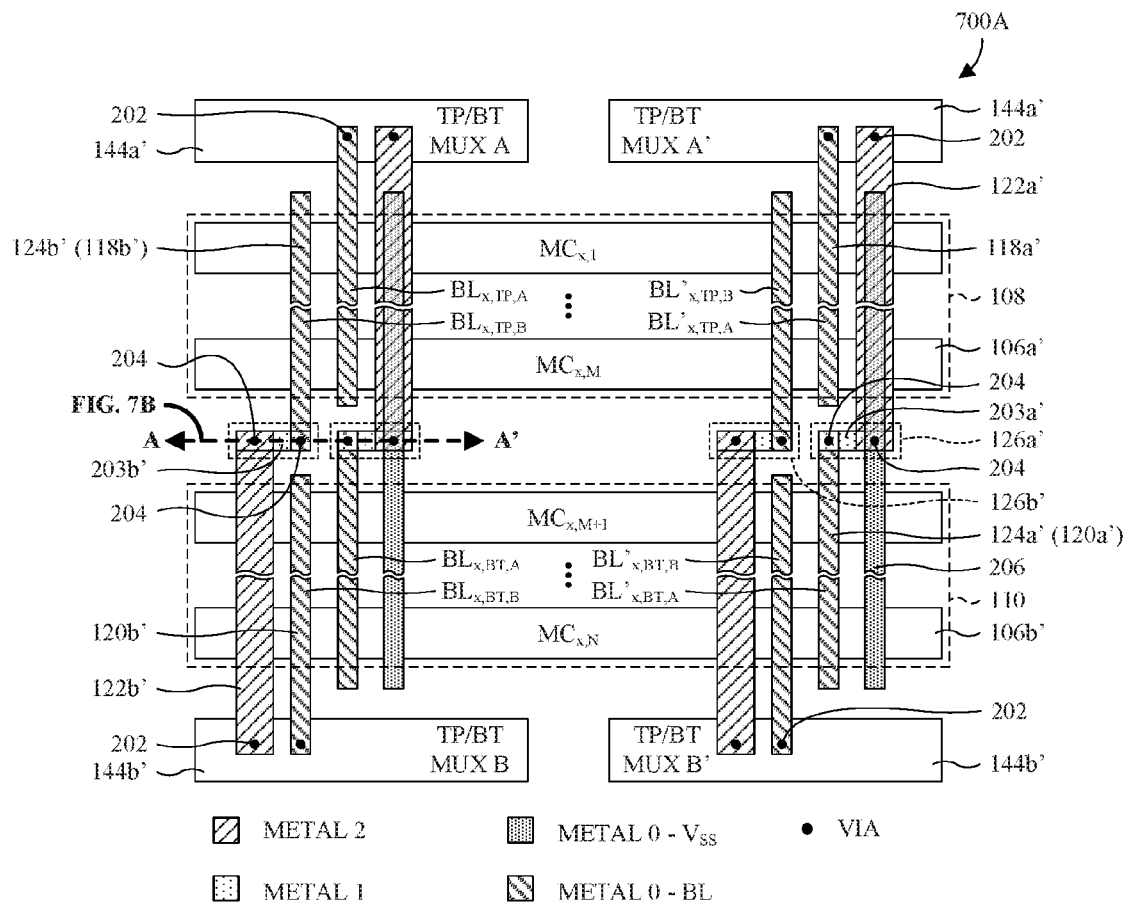
FIG. 7A illustrates a layout view of some embodiments of bit lines within a column of the DP SRAM device of FIG. 6.

With reference to FIG. 7A, a layout view 700A of some embodiments of bit lines 118*a'*, 118*b'*, 120*a'*, 120*b'* within a column of the DP SRAM device 102 of FIG. 6 is provided. As illustrated, FIG. 7A is a variant of FIG. 2A in which I/O is distributed between opposite ends of the column. For example, port A I/O is on a first end of the column, and port B I/O is on a second end of the column that is opposite the first end.

Bottom, port A bit lines 120*a'* (e.g., $BL_{x,BT,A}/BL'_{x,BT,A}$) extend from port A subarray multiplexers 144*a'* on the first end of the column, laterally along the column, to the second end of the column. Further, the bottom, port A bit lines 120*a'* each comprise a port A fly bit line segment 122*a'*, a port A local bit line segment 124*a'*, and a port A jump cell 126*a'*. The port A fly bit line segments 122*a'* extend over a top memory cell subarray 108, and the port A local bit line segments 124*a'* extend over a bottom memory cell subarray 110 to electrically couple with memory cells in the bottom memory cell subarray 110.

Similarly, top, port B bit lines 118*b'* (e.g., $BL_{x,TP,B}/BL'_{x,TP,B}$) extend from port B subarray multiplexers 144*b'* on the second end of the column, laterally along the column, to the first end. Further, the top, port B bit lines 118*b'* each comprise a port B fly bit line segment 122*b'*, a port B local bit line segment 124*b'*, and a port B jump cell 126*b'*. The port B fly bit line segments 122*b'* extend over the bottom memory cell subarray 110, and the port B local bit line segments 124*b'* extend over the top memory cell subarray 108 to electrically couple with memory cells in the top memory cell subarray 108.

In some embodiments, the port A and B fly bit line segments 122*a'*, 122*b'* are in the same metal layer of a BEOL interconnect structure as the port A and B local bit line segments 124*a'*, 124*b'*. For example, the port A and B fly bit line segments 122*a'*, 122*b'* and the port A and B local bit line segments 124*a'*, 124*b'* may be in a metal 2 layer. Alternatively, in other embodiments, the port A and B fly bit line segments 122*a'*, 122*b'* are in a different metal layer of a BEOL interconnect structure as the port A and B local bit line segments 124*a'*, 124*b'*. For example, the port A and B fly bit line segments 122*a'*, 122*b'* may be in a metal 2 layer, and the port A and B local bit line segments 124*a'*, 124*b'* may be in a metal 0 layer.

The port A jump cells 126*a'* are between the top and bottom memory cell subarrays 108, 110 and electrically couple the port A fly bit line segments 122*a'* respectively to the port A local bit line segments 124*a'*. Similarly, the port B jump cells 126*b'* are between the top and bottom memory cell subarrays 108, 110 and electrically couple the port B fly bit line segments 122*b'* respectively to the port A local bit line segments 124*b'*. Further, the port A jump cells 126*a'* each comprise a port A transition bit line segment 203*a'*, and the port B jump cells 126*b'* each comprise a port B transition bit line segment 203*b'*. The port A and B transition bit line segments 203*a'*, 203*b'* electrically couple to the port A and B fly bit line segments 122*a'*, 122*b'* and the port A and B local bit line segments 124*a'*, 124*b'* through second vias 204. In some embodiments, the port A and B fly bit line segments 122*a'*, 122*b'* are in a first metal layer (e.g., a metal 2 layer), the port A and B local bit line segments 124*a'*, 124*b'* are in a second metal layer (e.g., a metal 0 layer), and the port A and B transition bit line segments 203*a'*, 203*b'* are in a third metal layer (e.g., a metal 1 layer) between the first and second metal layers.

Top, port A bit lines 118*a'* (e.g., $BL_{x,TP,A}/BL'_{x,TP,A}$) extend laterally along the column, respectively from the port A subarray multiplexers 144*a'*, and terminate between the top and bottom memory cell subarrays 108, 110. Further, the top, port A bit lines 118*a'* electrically couple with the memory cells 106*a'* in the top memory cell subarray 108. Similarly, bottom, port B bit lines 120*b'* (e.g., $BL_{x,BT,B}/BL'_{x,BT,B}$) extend laterally along the column, respectively from the port B subarray multiplexers 144*b'*, and terminate between the top and bottom memory cell subarrays 108, 110. Further, the bottom, port B bit lines 120*b'* electrically couple with the memory cells 106*b'* in the bottom memory cell subarray 110.

In some embodiments, the top, port A bit lines 118*a'* and the bottom, port B bit lines 120*b'* extend along the same metal layer of a BEOL interconnect structure as the port A and B local bit line segments 124*a'*, 124*b'*. Further, in some embodiments, the top, port A bit lines 118*a'* and the bottom, port B bit lines 120*b'* extend along the same metal layer of the BEOL interconnect structure as the port A and B fly bit line segments 122*a'*, 122*b'*. Even more, in some embodiments, the top, port A bit lines 118*a'* and the bottom, port B bit lines 120*b'* extend along a different metal layer of the BEOL interconnect structure as the port A and B fly bit line segments 122*a'*, 122*b'* and/or as the port A and B local bit line segments 124*a'*, 124*b'*. For example, the top, port A bit lines 118*a'* and the bottom, port B bit lines 120*b'* may extend along a metal 0 layer with the port A and B local bit line segments 124*a'*, 124*b'*, and the port A and B fly bit line segments 122*a'*, 122*b'* may extend along a metal 2 layer.

Also illustrated by the layout view 700A, one or more $V_{ss}$ lines 206 extend laterally from the first end of the column to the second end of the column, and electrically couple with the memory cells 106a', 106b' of the column (e.g., $MC_{x,1}$ to $MC_{x,N}$). In some embodiments, the $V_{ss}$ line(s) 206 extend laterally in the metal 0 layer and/or are overlapped by port A fly bit line segments (e.g., the fly bit line segments of $BL_{x,BT,A}$ and $BL'_{x,BT,A}$). Alternatively, in some embodiments, the $V_{ss}$ line(s) 206 extend laterally in the metal 2 layer and/or overlap port A fly bit line segments (e.g., the fly bit line segments of $BL_{x,BT,A}$ and $BL'_{x,BT,A}$).

Figure 7B:
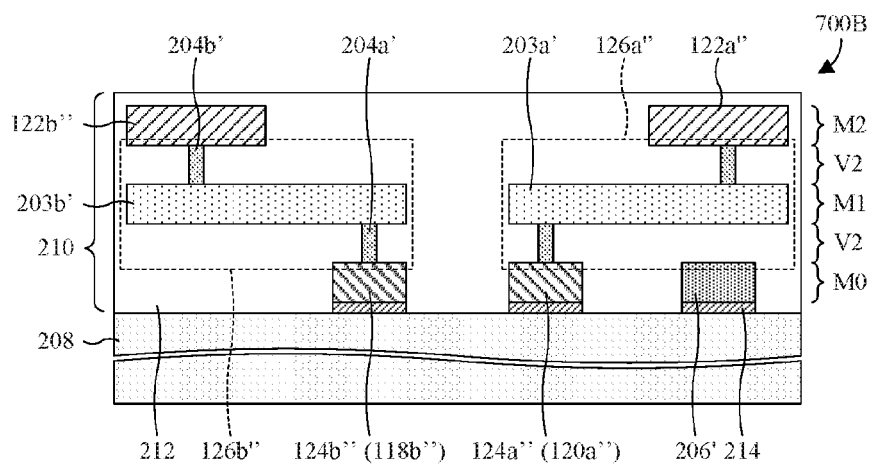
FIG. 7B illustrates a cross-sectional view of some embodiments of jump cells within the column of FIG. 7A.

With reference to FIG. 7B, a cross-sectional view 700B of some embodiments of jump cells 126a", 126b" within the column FIG. 7A is provided. The cross-sectional view 700B may, for example, be taken along line A-A' in FIG. 7A, and the jump cells 126a", 126b" are representative of the jump cell 126a', 126b' within the column of FIG. 7A.

As illustrated, metal layers M0, M1, M2 and via layers V1, V2 define a bottom, port A bit line 120a" and a top, port B bit line 118b". The bottom, port A bit line 120a" and the top, port B bit line 118b" each comprise a fly bit line segment 122a", 122b", a transition bit line segment 203a', 203b', and a local bit line segment 124a", 124b". The fly bit line segment 122a", 122b" is in a different metal layer than the local bit line segment 124a", 124b", and the transition bit line segment 203a', 203b' is in a metal layer between the different metal layers. For example, the fly bit line segment 122a", 122b" may be in a metal 2 layer (i.e., M2), the transition bit line segment 203a', 203b' may be in a metal 1 layer (i.e., M1), and the local bit line segment 124a", 124b" may be in a metal 0 layer (i.e., M0). Further, the bottom, port A bit line 120a" and the top, port B bit line 118b" each comprise a first via 204a' and a second via 204b'. The first via 204a' electrically couples the local bit line segment 124a", 124b" to the transition bit line segment 203a', 203b' in, for example, a via 1 layer (i.e., V1). The second via 204b' electrically couples the transition bit line segment 203a', 203b' to the fly bit line segment 122a", 122b" in, for example, a via 2 layer (i.e., V2).

Figure 8:
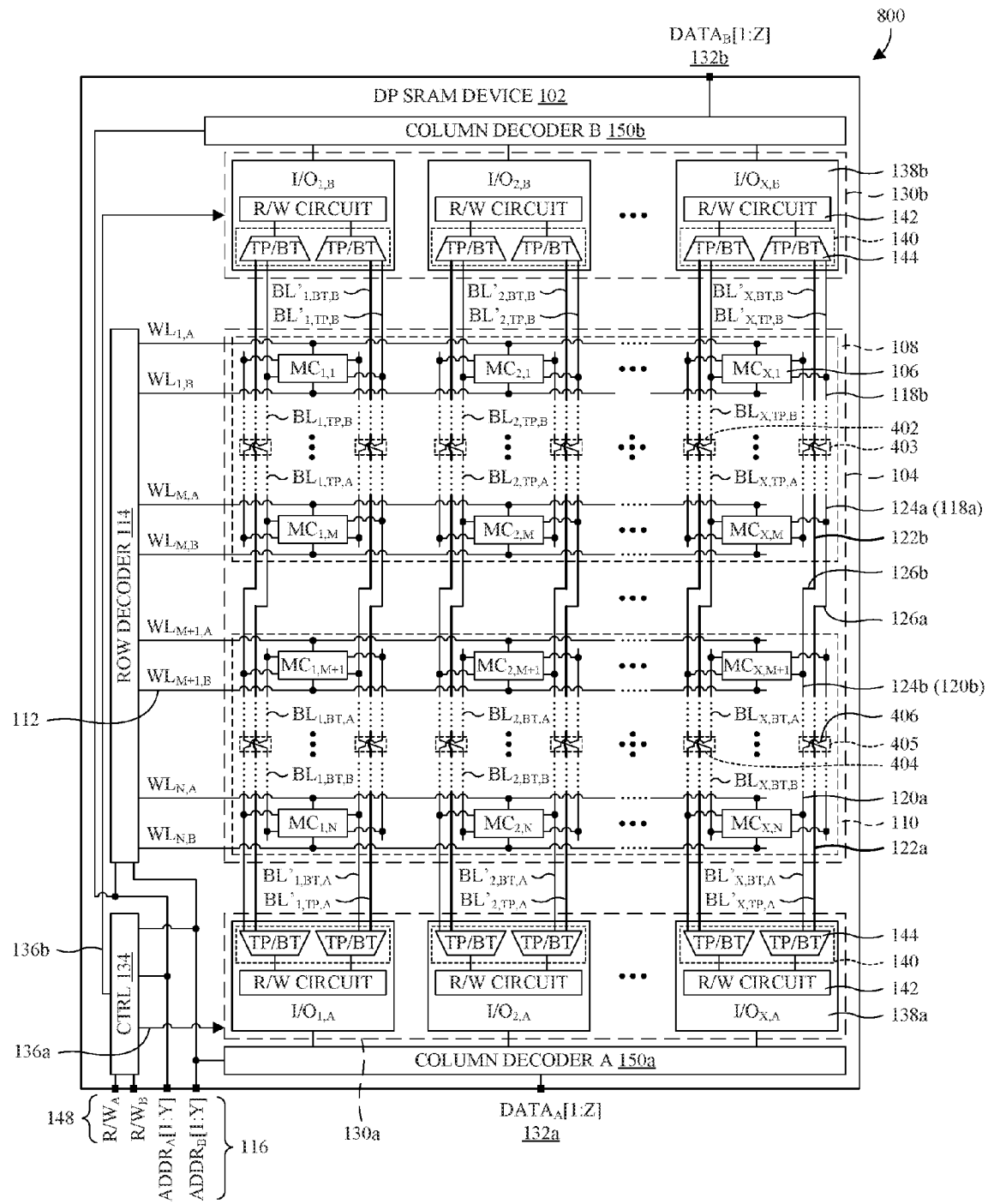
FIG. 8 illustrates a block diagram of some other embodiments of the DP SRAM device of FIG. 6 with twist cells.

With reference to FIG. 8, a block diagram 800 of some other embodiments of the DP SRAM device 102 of FIG. 6 is provided. As illustrated, I/O for port A and port B is reversed relative to FIG. 6. Further, top bit lines 118a, 118b respectively comprise top twist cells 402, 403 between row 1 and row M, and bottom bit lines 120a, 120b respectively comprise bottom twist cells 404, 405 between row M+1 and row N. The top and bottom twist cells 402, 403, 404, 405 are each configured to twist a pair of neighboring bit lines and are each made up of a pair of cross segments 406. Further, the top and bottom twist cells 402, 403, 404, 405 are configured as described with regard to FIG. 4. In some embodiments, each of the top twist cells 402, 403 has one of the port B fly bit line segments 122b (e.g., the fly bit line segment of $BL'_{X,BT,B}$) laterally spaced between the neighboring bit lines of the top twist cell, and/or each of the bottom twist cells 404, 405 has one of the port A fly bit line segments 122a (e.g., the fly bit line segment of $BL_{1,BT,A}$) laterally spaced between the neighboring bit lines of the bottom twist cell.

Figure 9A:
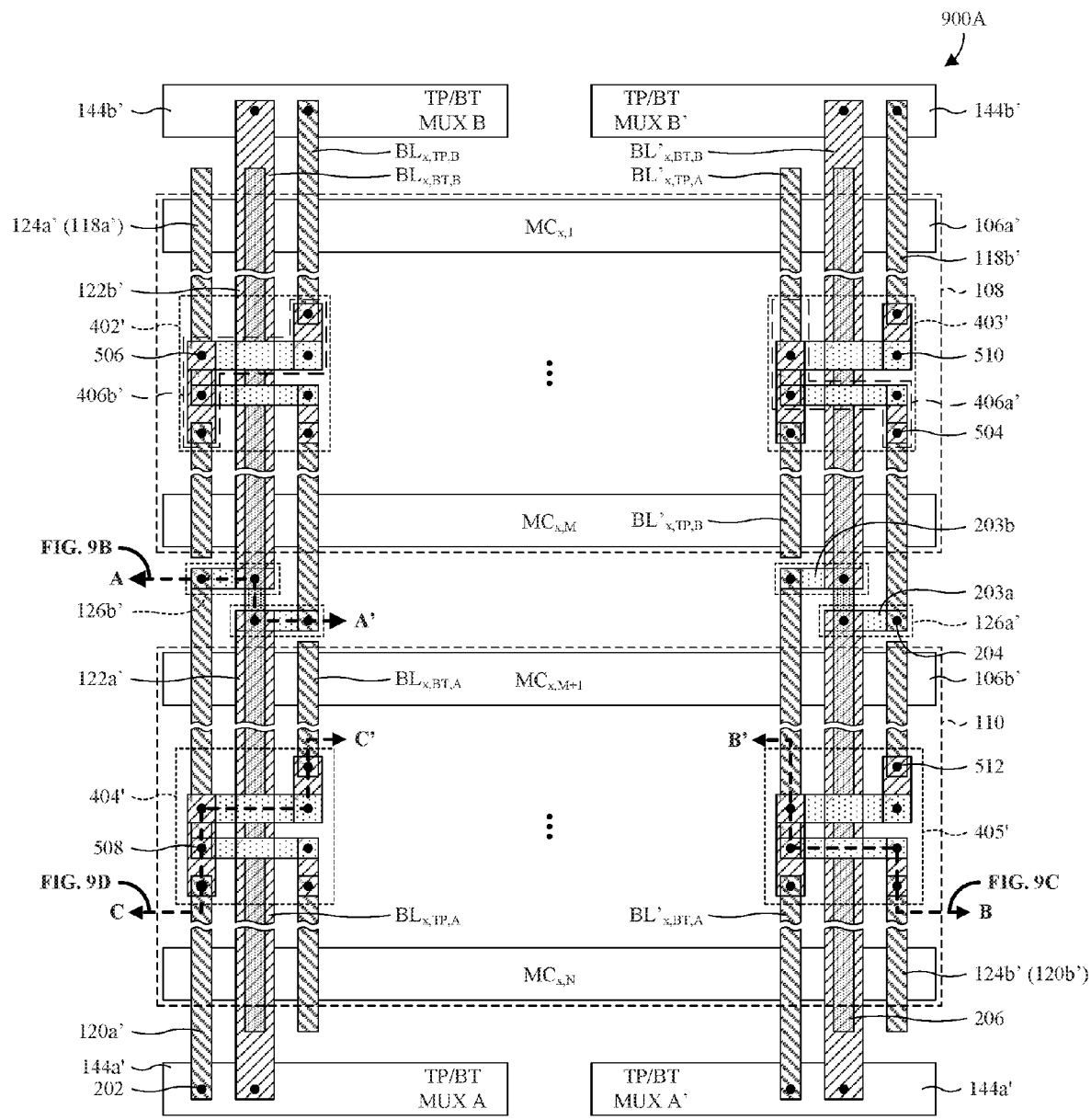
FIG. 9A illustrates a layout view of some embodiments of bit lines within a column the DP SRAM device of FIG. 8.

With reference to FIG. 9A, a layout view 900A of some embodiments of bit lines 118a', 118b', 120a', 120b' within a column of the DP SRAM device 102 of FIG. 8 is provided. As illustrated, FIG. 9A is a variant of FIG. 7A in which I/O for port A and port B is reversed. Further, top bit lines 118a', 118b' comprise top twist cells 402', 403' over a top memory cell subarray 108, and bottom bit lines 120a', 120b' comprise bottom twist cells 404', 405' over a bottom memory cell subarray 110. The top and bottom twist cells 402', 403', 404', 405' are each configured to twist a respective pair of neighboring bit lines, and are each made up of a cross under segment 406a' and a cross over segment 406b'. Further, the top and bottom twist cells 402', 403', 404', 405' are configured as described in FIG. 5A.

In some embodiments, each of the top twist cells 402', 403' has one of the port B fly bit line segments 122b' (e.g., the fly bit line segment of $BL'_{x,BT,B}$) laterally spaced between the neighboring bit lines (e.g., $BL'_{x,TP,A}/BL'_{x,TP,B}$) of the top twist cell, and/or each of the bottom twist cells 404', 405' has one of the port A fly bit line segments 122a' (e.g., the fly bit line segment of $BL'_{x,TP,A}$) laterally spaced between the neighboring bit lines (e.g., $BL'_{x,BT,A}$ and $BL'_{x,BT,B}$) of the bottom twist cell. Further, in some embodiments, each of the top and bottom twist cells 402', 403', 404', 405' has one of the $V_{ss}$ line(s) 206 laterally spaced between the neighboring bit lines (e.g., $BL'_{x,BT,A}$ and $BL'_{x,BT,B}$) of the twist cell.

Figure 9B:
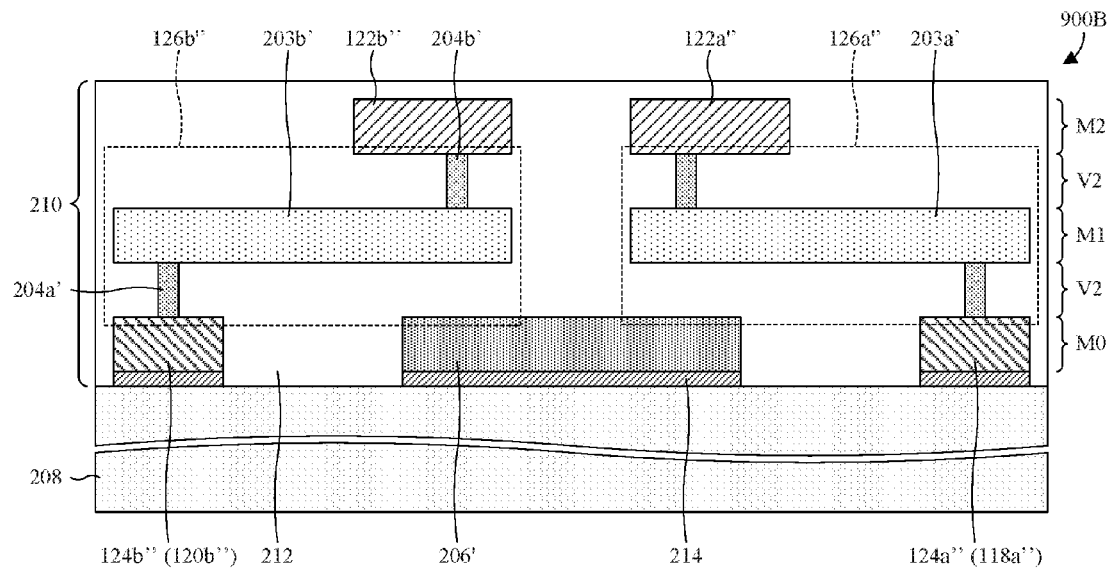
FIG. 9B illustrates a cross-sectional view of some embodiments of jump cells within the column of FIG. 9A.

With reference to FIG. 9B, a cross-sectional view 900B of some embodiments of jump cells 126a", 126b" within the column of FIG. 9A provided. The cross-sectional view 900B may, for example, be taken along line A-A' in FIG. 9A, and the jump cells 126a", 126b" are representative of the jump cell 126a', 126b' within the column of FIG. 9A. As illustrated, FIG. 9B is a variant of FIG. 7B in which a port A jump cell 126a" is arranged along a top, port A bit line 118a", and in which a port B jump cell 126b" is arranged along a bottom, port B bit line 120b", so as to integrate with the top and bottom twist cells 402', 403', 404', 405' of FIG. 9A.

Figure 9C:
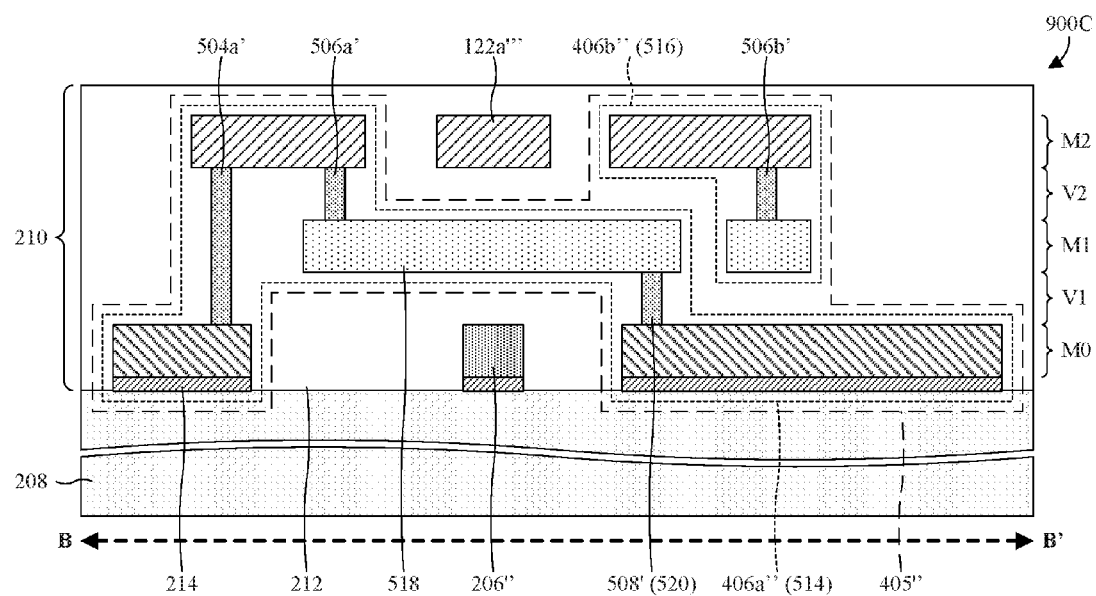
FIG. 9C illustrates a cross-sectional view of some embodiments of a twist cell within the column of FIG. 9A.

With reference to FIG. 9C, a cross-sectional view 900C of some embodiments of a bottom twist cell 405" within the column of FIG. 9A is provided. The bottom twist cell 405" is representative of each of the bottom twist cell 404', 405' within the column of FIG. 9A, as well as each of the top twist cells 402', 403' within the column of FIG. 9A. Further, the cross-sectional view 900C may, for example, be taken along line B-B' in FIG. 9A, which extends along a cross under segment 406a" of the bottom twist cell 404". As illustrated, FIG. 9C is a variant of FIG. 5C in which the bottom twist cell 405" has been modified to accommodate port A and B I/O respectively on opposite sides of the column. In contrast with the embodiments of FIG. 5C, the embodiments of FIG. 9C have a single fly bit line segment 122a'''.

Figure 9D:
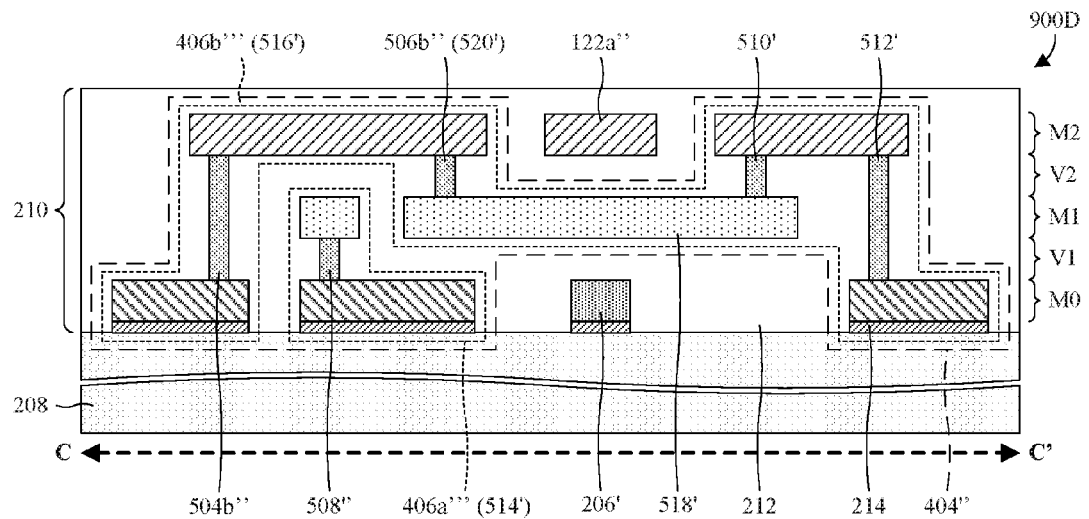
FIG. 9D illustrates another cross-sectional view of some embodiments of a twist cell within the column of FIG. 9A.

With reference to FIG. 9D, another cross-sectional view 900D of some embodiments of a bottom twist cell 404" within the column of FIG. 9A is provided. The bottom twist cell 404" is representative of each of the bottom twist cell 404', 405' within the column of FIG. 9A, as well as each of the top twist cells 402', 403' within the column of FIG. 9A. Further, the cross-sectional view 900D may, for example, be taken along line C-C' in FIG. 9A, which extends along a cross over segment 406b'" of the bottom twist cell 404". As illustrated, FIG. 9D is a variant of FIG. 5D in which the bottom twist cell 404" has been modified to accommodate port A and B I/O respectively on opposite sides of the column. In contrast with the embodiments of FIG. 5D, the embodiments of FIG. 9D have a single fly bit line segment 122a".

Figure 10A:
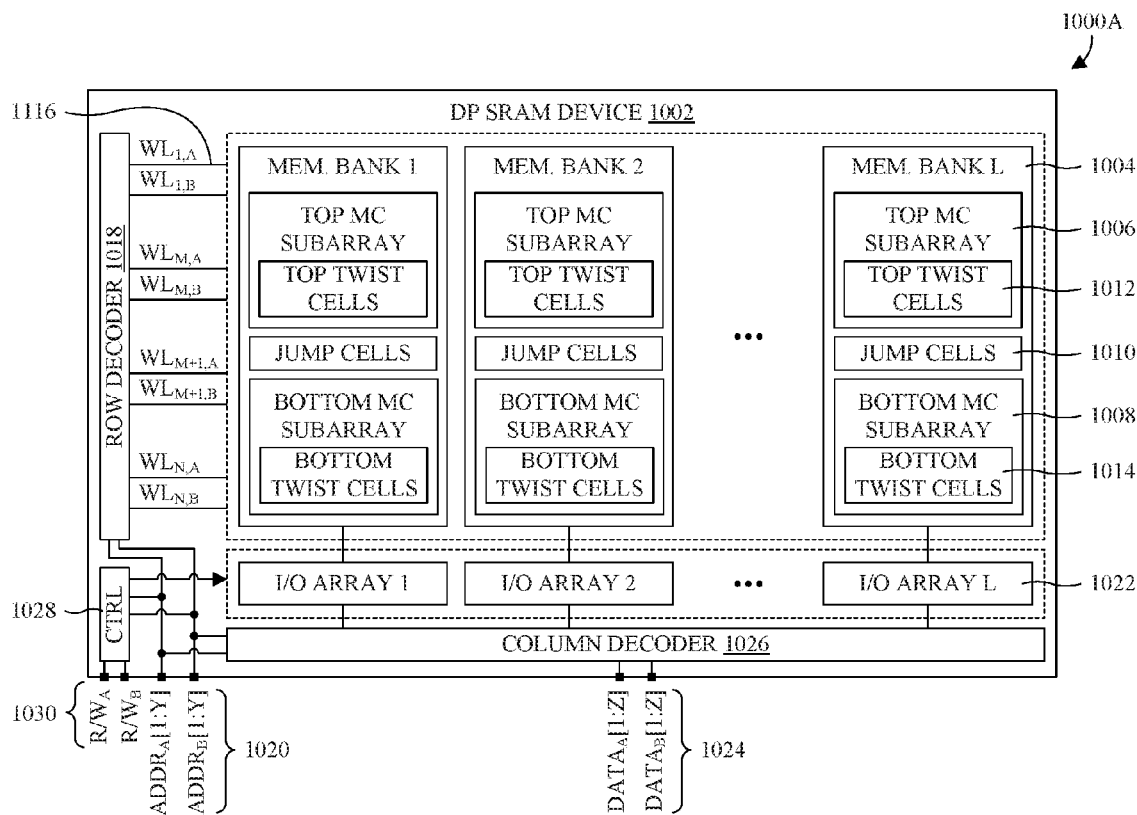
FIG. 10A illustrates a block diagram of some embodiments of a multi-bank DP SRAM device.

With reference to FIG. 10A, a block diagram 1000A of some embodiments of a multi-bank DP SRAM device 1002 is provided. As illustrated, the multi-bank DP SRAM device 1002 comprises L memory banks 1004, where L is an integer greater than 0. The L memory banks 1004 are memory cell arrays each having N rows of memory cells and X columns of memory cells. N and X are integers greater than zero and may, for example, be the same across the L memory banks 1004. Further, the L memory banks 1004 each have the same configuration of memory cells and bit lines as the memory cell array 104 of FIG. 1 or 4.

The L memory banks 1004 each comprise a top memory cell subarray 1006, a bottom memory cell subarray 1008, and jump cells 1010. Further, in some embodiments, the L memory banks 1004 each comprise top twist cells 1012 and bottom twist cells 1014. The top and bottom memory cell subarrays 1006, 1008 are configured in the same manner as the top and bottom memory cell subarrays 108, 110 in FIG. 1 or 4. As such, the top memory cell subarrays 1006 accommodate memory cells in rows 1 to M of the L memory banks 1004, and the bottom memory cell subarrays 1006 accommodate memory cells in rows M+1 to N of the L memory banks 1004, where M is an integer greater than zero and less than N.

The jump cells 1010 are between the top and bottom memory cell subarrays 1006, 1008, and may, for example, be configured in the same manner as the jump cells 126 of FIG. 1 or 4. The top twist cells 1012 are in the top memory cell subarrays 1006, and may, for example, be configured in the same manner as the top twist cells 402, 403 of FIG. 4. The bottom twist cells 1014 are in the bottom memory cell subarrays 1008, and may, for example, be configured the same manner as the bottom twist cells 404, 405 of FIG. 4.

Advantageously, since the L memory banks 1004 each have the same configuration of memory cells and bit lines as the memory cell array 104 of FIG. 1 or 4, the multi-bank DP SRAM device 1002 uses separate bit lines for the top memory cell subarrays 1006 and the bottom memory cell subarrays 1008. This leads to low loads on the bit lines, such that the L memory banks 1004 may be large. Further, the large memory banks allow the multi-bank DP SRAM device 1002 to have a small area (e.g., a small footprint). Namely, for a given memory size, a few large memory banks use less area than many small memory banks.

A set of word lines 1016 is shared by the L memory banks 1004 and facilitates access to memory cells of the L memory banks 1004 on a row-by-row basis. The word lines 1016 comprise a port A word line (e.g., $WL_{1,A}$) for each row and a port B word line (e.g., $WL_{1,B}$) for each row. Further, the word lines 1016 extend laterally from a row decoder 1018, along respective rows, to electrically couple with memory cells in the respective rows for each of the L memory banks 1004. The row decoder 1018 is configured to selectively enable the word lines 1016 based on address signals 1020 respectively for port A and port B. The address signals 116 carry respective Y-bit addresses, where Y is an integer greater than zero.

A plurality of I/O arrays 1022 corresponding to the L memory banks 1004 are configured to use bit lines of the L memory banks 1004 to read from and/or write to memory cells accessed by the word lines 1016 and the row decoder 1018. Further, the I/O arrays 1022 are configured to output data read from the accessed memory cells to data signals 1024 respectively for port A and port B, and/or to write data input on the data signals 1024 to the accessed memory cells. The data signals 1024 carry Z bit data values, where Z is an integer greater than zero. The I/O arrays 1022 are made up of I/O cells (not shown) and are each configured as the I/O array 130 of FIG. 1 or 4.

In some embodiments, the data signals 1024 pass to the I/O arrays 1022 through a column decoder 1026. The column decoder 1026 is configured to electrically couple the data signals 1024 to I/O cells corresponding to the Y-bit addresses. For example, a Y-bit address (e.g., on $ADDR_A$) of a port may identify Z memory cells spread across a series of Z memory banks (e.g., memory banks 1 through Z), where the memory cells are at the same row, and the same column, in the corresponding memory banks. In this example, the column decoder 1026 electrically couples bits 1 through Z of a data signal (e.g., $DATA_A$) for the port to the I/O cells for the Z memory cells.

A controller 1028 is configured to control the I/O arrays 1022 and, in some embodiments, the row decoder 1018 and/or the column decoder 1026, to perform read and/or write operations on port A and port B. Such control is based off R/W signals 1030 respectively for port A and port B, as well as the address signals 1020. For example, a row of memory cells corresponding to a port A Y-bit address may be accessed through a port A word line (e.g., $WL_{M,A}$). Thereafter, port A bit lines (not shown) corresponding to the port A Y-bit address may be selected, and a read or write operation may be performed with the selected bit lines. Such read or write operation may vary depending upon whether a port A R/W signal (e.g., $R/W_A$) identifies a read operation or a write operation.

Figure 10B:
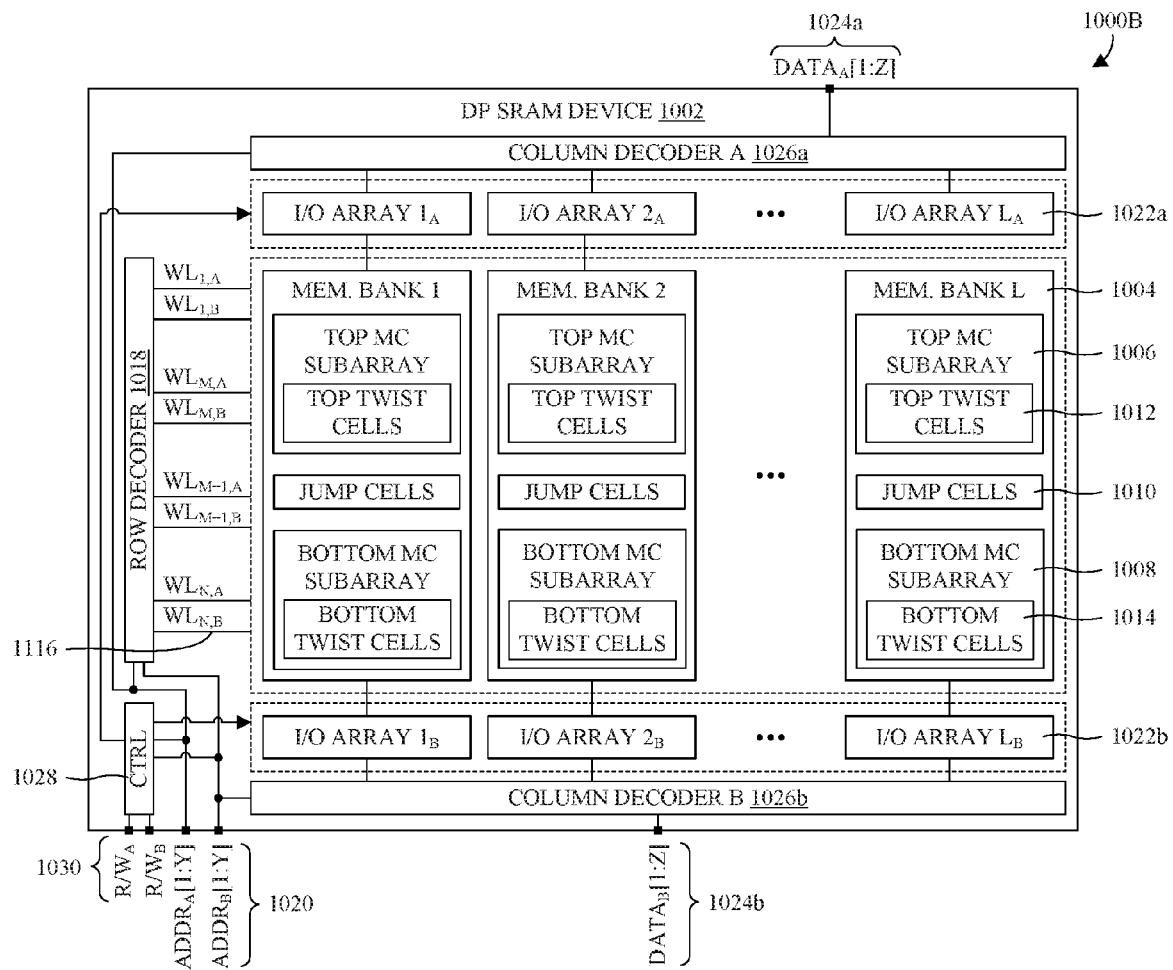
FIG. 10B illustrates a block diagram of some other embodiments of the multi-bank DP SRAM device of FIG. 10A in which I/O is distributed between opposite sides of the multi-bank DP SRAM device.

With reference to FIG. 10B, a block diagram 1000B of some other embodiments of the multi-bank DP SRAM device 1002 of FIG. 10A is provided. As illustrated, I/O is distributed between opposite sides of the multi-bank DP SRAM device 1002, such that the L memory banks 1004 each have the same configuration of memory cells (not shown) and bit lines (not shown) as the memory cell array 104 of FIG. 6 or 8. Further, the jump cells 1010 may, for example, be configured as the jump cells 126a, 126b of FIG. 6 or 8. Even more, in embodiments with the top and bottom twist cells 1012, 1014, the top twist cells 1012 may, for example, be configured as the top twist cells 402, 403 of FIG. 8 and the bottom twist cells 1014 may, for example, be configured as the bottom twist cells 404, 405 of FIG. 8.

A plurality of port A I/O arrays 1022a are arranged on a first side of the multi-bank DP SRAM device 1002, and a plurality of port B I/O arrays 1022b are arranged on a second side of the multi-bank DP SRAM device 1002 that is opposite the first side. In some embodiments, the port A I/O arrays 1022a neighbor the top memory cell subarrays 1006, and the port B I/O arrays 1022b neighbor the bottom memory cell subarrays 1008. In other embodiments, the port A I/O arrays 1022a neighbor the bottom memory cell subarrays 1008, and the port B I/O arrays 1022b neighbor the top memory cell subarrays 1006. The port A and B I/O arrays 1022a, 1022b have the same configuration as the I/O arrays 130a, 130b of FIG. 6 or 8. Further, in some embodiments, a port A column decoder 1026a is configured to electrically couple a port A data signal 1024a to the port A I/O arrays 1022a, and/or a port B column decoder 1026b is configured to electrically couple a port B data signal 1024b to the port B I/O arrays 1022b.

Figure 11:
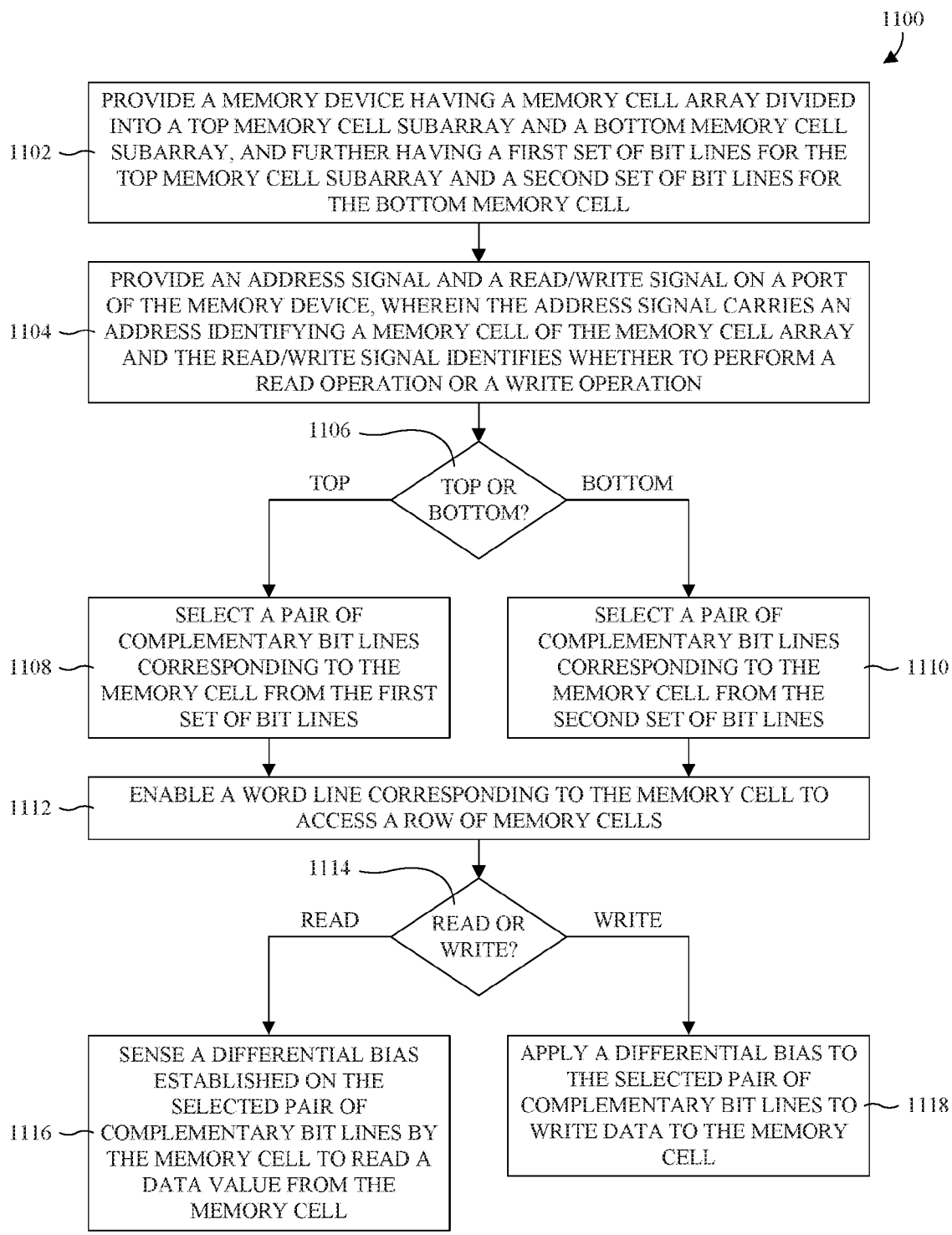
FIG. 11 illustrates a flowchart of some embodiments of a method for reading and/or writing data with a flying and/or twisted bit line architecture.

With reference to FIG. 11, a flowchart 1100 of some embodiments of a method for reading and/or writing data with a flying and/or twisted bit line architecture is provided.

At 1102, a memory device is provided. The memory device has a memory cell array divided into a top memory cell subarray and a bottom memory cell subarray. Further, the memory device has a first set of bit lines for the top memory cell subarray and a second set of bit lines for the bottom memory cell. The first set of bit lines comprises a port A pair of CBLs for each column of the memory cell array, and a port B pair of CBLs for each column of the memory cell array. Similarly, the second set of bit lines comprises a port A pair of CBLs for each column of the memory cell array, and a port B pair of CBLs for each column of the memory cell array.

At 1104, an address signal and a read/write signal are provided on port A or B. The address signal carries an address identifying a memory cell of the memory device. In some embodiments, the address also identifies one or more other memory cells of the memory device. The read/write signal identifies whether to perform a read or write operation.

At 1106, a determination is made as to whether the memory cell is in the top memory cell subarray or the bottom memory cell subarray based on the address. If the memory cell is in the top memory cell subarray, a pair of CBLs corresponding to the memory cell is selected from the first set of bit lines at 1108. If the memory cell is in the bottom memory cell subarray, the pair of CBLs corresponding to the memory cell is selected from the bottom memory cell subarray at 1110. In either case, the selection also accounts for the port on which the address is provided. As such, the selected pair of CBLs is a port A pair of CBLs when the address is provided on port A, and a port B pair of CBLs when the address is provided on port B.

At 1112, a word line of the memory device is enabled to access a row of the memory cell array corresponding to the memory cell. The word line is a port A word line when the address is provided on port A, and is a port B word line when the address is provided on port B.

At 1114, a determination is made as to whether to read or write to the memory cell. The determination is made based on the read/write signal. If a read determination is made, a differential bias established on the selected pair of CBLs by the memory cell is sensed to read data from the memory cell at 1116. If a write determination is made, a differential bias is applied to the selected bit lines to write data to the memory cell at 1118.

While the flowchart 1100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide a semiconductor memory device. An array of memory cells is arranged in rows and columns. The array includes a first subarray of memory cells and a second subarray of memory cells. A first pair of CBLs extends along a column of the array, from a first side of the array, and terminates between the first and second subarrays. The first pair of CBLs is electrically coupled to memory cells of the first subarray in the column. A second pair of CBLs extends from the first side of the array, along the column, to a second side of the array. The second pair of CBLs is electrically coupled to memory cells of the second subarray in the column. The CBLs of the second pair of CBLs have stepped profiles between the first and second subarrays. A third pair of CBLs and a fourth pair of CBLs extend along the column. The third and fourth pairs of CBLs are electrically coupled respectively to the memory cells of the first subarray in the column and the memory cells of the second subarray in the column.

Further, other embodiments of the present application provide another semiconductor memory device. An array of memory cells is arranged in rows and columns. The array includes a first subarray of memory cells and a second subarray of memory cells. A first pair of CBLs extends along a column of the array, from a first side of the array, and terminates between the first and second subarrays. The first pair of CBLs is electrically coupled to memory cells of the first subarray in the column. A second pair of CBLs extends from the first side of the array, along the column, to a second side of the array. The second pair of CBLs is electrically coupled to memory cells of the second subarray in the column. A third pair of CBLs and a fourth pair of CBLs extend along the column. The third and fourth pairs of CBLs are electrically coupled respectively to the memory cells of the first subarray in the column and the memory cells of the second subarray in the column. A twist cell is configured to twist a pair of neighboring bit lines respectively from two pairs of CBLs extending along the column. The two pairs of CBLs correspond to two of the first, second, third, and fourth pairs of CBLs.

Further yet, other embodiments of the present application provide yet another semiconductor memory device. An array of memory cells is arranged in rows and columns. The array includes a first subarray of memory cells and a second subarray of memory cells. A first pair of CBLs extends along a column of the array, from a first side of the array, and terminates between the first and second subarrays. The first pair of CBLs is electrically coupled to memory cells of the first subarray in the column. A second pair of CBLs extends from the first side of the array, along the column, to a second side of the array. The second pair of CBLs is electrically coupled to memory cells of the second subarray in the column. The CBLs of the second pair of CBLs have stepped profiles between the first and second subarrays. A third pair of CBLs and a fourth pair of CBLs extend along the column. The third and fourth pairs of CBLs are electrically coupled respectively to the memory cells of the first subarray and the memory cells of the second subarray. The CBLs of the third or fourth pair of CBLs have stepped profiles between the first and second subarrays. A twist cell configured to respectively twist a pair of neighboring bit lines. The neighboring bit lines are respectively from two pairs of CBLs extending along the column, and the two pairs of CBLs correspond to two of the first, second, third, and fourth pairs of CBLs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory device comprising:
    an array of memory cells arranged in rows and columns, wherein the array includes a first subarray of memory cells and a second subarray of memory cells;
    a first bit line extending along a column of the array, from a first side of the array, and terminating between the first and second subarrays, wherein the first bit line is electrically coupled to memory cells of the first subarray in the column; and
    a second bit line extending from the first side of the array, along the column, to a second side of the array, wherein the second bit line is electrically coupled to memory cells of the second subarray in the column, wherein the second bit line overlies and is electrically separated from the first subarray, and wherein the second bit line has a stepped profile between the first and second subarrays.

2. The semiconductor memory device according to claim 1, wherein the second bit line comprises a fly bit line segment overlying the first subarray and elevated above the first bit line, and wherein the fly bit line segment extends laterally along the column, from the first side of the array, and terminates between the first and second subarrays.

3. The semiconductor memory device according to claim 2, wherein the second bit line further comprises a local bit line segment and a jump cell, wherein the local bit line segment is on the second subarray and is recessed below the fly bit line segment, wherein the local bit line segment extends laterally along the column, from the second side of the array, and terminates between the first and second subarrays, wherein the jump cell is between the local and fly bit line segments and electrically couples the fly bit line segment to the local bit line segment.

4. The semiconductor memory device according to claim 3, wherein the first bit line and the local bit line segment are aligned along the column, and wherein the first bit line and the local bit line segment are recessed below the fly bit line segment by the same amount.

5. The semiconductor memory device according to claim 1, wherein the second bit line has a top layout that is stepped between the first and second subarrays.

6. The semiconductor memory device according to claim 1, further comprising:
a third bit line extending laterally and substantially in parallel with the column, from the second side of the array, and terminating between the first and second subarrays; and
a fourth bit line extending laterally and substantially in parallel with the column from the second side of the array, along the column, to the first side of the array, wherein the fourth bit line is stepped between the first and second subarrays.

7. The semiconductor memory device according to claim 1, further comprising:
a third bit line extending laterally and substantially in parallel with the column, from the first side of the array, and terminating between the first and second subarrays; and
a fourth bit line extending laterally and substantially in parallel with the column from the first side of the array, along the column, to the second side of the array, wherein the fourth bit line is stepped between the first and second subarrays.

8. The semiconductor memory device according to claim 1, wherein the first subarray is along a first end of the column, spaced from a second end of the column opposite the first end, and wherein the second subarray is along the second end, spaced from the first end.

9. The semiconductor memory device according to claim 1, further comprising:
a conductive line extending continuously along the column from the first side of the array to the second side of the array, wherein the conductive line underlies the second bit line at the first subarray and is laterally adjacent to the second bit line at the second subarray.

10. A semiconductor memory device comprising:
an array of memory cells arranged in rows and columns, wherein the array includes a first subarray of memory cells and a second subarray of memory cells, and wherein the first and second subarrays are respectively on a first side of the array and a second side of the array;
a first bit line extending along a column of the array, wherein the first bit line is electrically coupled to memory cells of the second subarray in the column;
a second bit line extending from the first side of the array, along the column, to the second side of the array, wherein the second bit line is electrically coupled to the memory cells of the second subarray in the column, and wherein the second bit line overlies and is electrically separated from the first subarray; and
a twist cell twisting the first and second bit lines between the memory cells of the second subarray.

11. The semiconductor memory device according to claim 10, wherein the first bit line extends from the first side of the array, along the column, to the second side of the array, and wherein the first bit line overlies and is electrically separated from the first subarray.

12. The semiconductor memory device according to claim 10, wherein the first bit line extends along the column, from the second side of the array, and terminates between the first and second subarrays.

13. The semiconductor memory device according to claim 10, wherein the first bit line extends to the twist cell along a first axis and in a direction, wherein the second bit line extends to the twist cell along a second axis and in the direction, wherein the first and second axes are substantially parallel, wherein the first bit line extends from the twist cell along the second axis and in the direction, and wherein the second bit line extends from the twist cell along the first axis and in the direction.

14. The semiconductor memory device according to claim 10, further comprising:
a third bit line extending from the second side of the array, along the column, to the first side of the array while laterally spaced between the first and second bit lines, wherein the third bit line extends directly over the twist cell and is electrically coupled to memory cells of the first subarray in the column.

15. The semiconductor memory device according to claim 10, further comprising:
a conductive line extending from the second side of the array, along the column, to the first side of the array while laterally spaced between the first and second bit lines, wherein the conductive line extends directly under the twist cell.

16. The semiconductor memory device according to claim 10, further comprising:
a third bit line and a fourth bit line extending laterally and substantially in parallel with the column, from the first side of the array, wherein the third and fourth bit lines terminate between the first and second subarrays; and
a second twist cell twisting the third and fourth bit lines between memory cells of the first subarray.

17. The semiconductor memory device according to claim 10, further comprising:
a third bit line extending laterally and substantially in parallel with the column, from the second side of the array to the first side of the array;
a fourth bit line extending laterally and substantially in parallel with the column, from the first side of the array, wherein the fourth bit line terminates between the first and second subarrays; and
a second twist cell twisting the third and fourth bit lines between memory cells of the first subarray.

18. A semiconductor memory device comprising:
- an array of memory cells arranged in rows and columns, wherein the array includes a first subarray of memory cells and a second subarray of memory cells;
- a first pair of complementary bit lines (CBLs) extending along a column of the array, from a first side of the array, and terminating between the first and second subarrays, wherein the first pair of CBLs is electrically coupled to memory cells of the first subarray in the column; and
- a second pair of CBLs extending from the first side of the array, along the column, to a second side of the array, wherein the second pair of CBLs is electrically coupled to memory cells of the second subarray in the column, and wherein the second pair of CBLs is elevated above the first pair of CBLs at the first subarray.

19. The semiconductor memory device according to claim 18, wherein the CBLs of the second pair are stepped between the first and second subarrays.

20. The semiconductor memory device according to claim 18, further comprising:
- a third pair of CBLs extending laterally and substantially in parallel with the column; and
- a twist cell twisting a first bit line of the first or second pair and a second bit line of the third pair.

* * * * *